US011193808B2

(12) United States Patent  
Zorzetto et al.

(10) Patent No.: US 11,193,808 B2  
(45) Date of Patent: Dec. 7, 2021

(54) DEVICE FOR DETECTING THE LEVEL OF A MEDIUM

(71) Applicant: ELTEK S.P.A., Casale Monferrato (IT)

(72) Inventors: Mauro Zorzetto, Casale Monferrato (IT); Giorgio Martinengo, Casale Monferrato (IT); Costanzo Gadini, Casale Monferrato (IT)

(73) Assignee: ELTEK S.P.A., Casale Monferrato (IT)

( * ) Notice: Subject to any disclaimer, the term of this patent is extended or adjusted under 35 U.S.C. 154(b) by 42 days.

(21) Appl. No.: 16/632,206

(22) PCT Filed: Jul. 13, 2018

(86) PCT No.: PCT/IB2018/055201  
§ 371 (c)(1),  
(2) Date: Jan. 17, 2020

(87) PCT Pub. No.: WO2019/016658  
PCT Pub. Date: Jan. 24, 2019

(65) Prior Publication Data  
US 2020/0232836 A1    Jul. 23, 2020

(30) Foreign Application Priority Data  
Jul. 20, 2017    (IT) .......................... 102017000082500

(51) Int. Cl.  
*G01F 23/26* (2006.01)  
*H05K 1/16* (2006.01)

(52) U.S. Cl.  
CPC .......... *G01F 23/266* (2013.01); *G01F 23/265* (2013.01); *G01F 23/268* (2013.01); *H05K 1/162* (2013.01)

(58) Field of Classification Search  
CPC .... G01F 23/263; G01F 23/265; G01F 23/266; G01F 23/268; H05K 1/162;  
(Continued)

(56) References Cited

U.S. PATENT DOCUMENTS 6,130,472 A * 10/2000 Feger .................... H01L 23/564  
257/643  
6,164,132 A    12/2000 Matulek  
(Continued)

FOREIGN PATENT DOCUMENTS

DE    195 04 608    8/1996  
EP    1 316 994    6/2003  
(Continued)

OTHER PUBLICATIONS

International Search Report and Written Opinion of the ISA for PCT/IB2018/055201, dated Oct. 16, 2018, 14 pages.

*Primary Examiner* — Francis C Gray  
(74) *Attorney, Agent, or Firm* — Nixon & Vanderhye P.C.

(57) ABSTRACT

A capacitive level sensor device, for detecting the level of a medium contained in a container, comprises a circuit support, which extends longitudinally substantially according to level-detection axis. The circuit support has, in a detection region thereof, at least one first plurality of first capacitive elements, which comprise at least one first array of first electrodes (J), preferably spaced from one another along the level-detection axis, which are arranged in a position corresponding to at least one first side of the circuit support. The sensor device has a casing body which comprises an electrically insulating and fluid-tight detection portion, which covers the detection region of the circuit support. The detection portion of the casing body comprises an overmoulded outer coating, made of a first electrically insulating polymeric material, which defines an outer surface of the casing body designed to be in contact with the medium the level of which has to be detected. The first electrodes (J) are enclosed within the supporting structure of the circuit support at least at the detection region thereof, and, at least at the detection region, between the overmoulded outer coating and the supporting structure of the circuit support there is set (Continued)

at least one intermediate layer made of an electrically insulating material different from the first material.

17 Claims, 22 Drawing Sheets

(58) Field of Classification Search
CPC . H05K 2201/10151; H05K 2203/1322; H05K 2203/1327; H05K 3/28
See application file for complete search history.

(56) References Cited

U.S. PATENT DOCUMENTS

| | | | |
|---|---|---|---|
| 2004/0183163 A1 | 9/2004 | Jiang et al. | |
| 2005/0280424 A1* | 12/2005 | Qu | G01F 23/268 324/663 |
| 2009/0139325 A1 | 6/2009 | Cunningham et al. | |
| 2009/0301189 A1* | 12/2009 | Ross, Jr. | G01F 23/268 73/304 C |
| 2011/0120219 A1 | 5/2011 | Barlesi et al. | |
| 2017/0191861 A1* | 7/2017 | Rondano | G01F 23/265 |
| 2019/0376830 A1* | 12/2019 | Park | G01F 23/266 |

FOREIGN PATENT DOCUMENTS

| | | |
|---|---|---|
| GB | 2 302 946 | 2/1997 |
| JP | H1183593 | 3/1999 |
| WO | 2015/181770 | 12/2015 |

\* cited by examiner

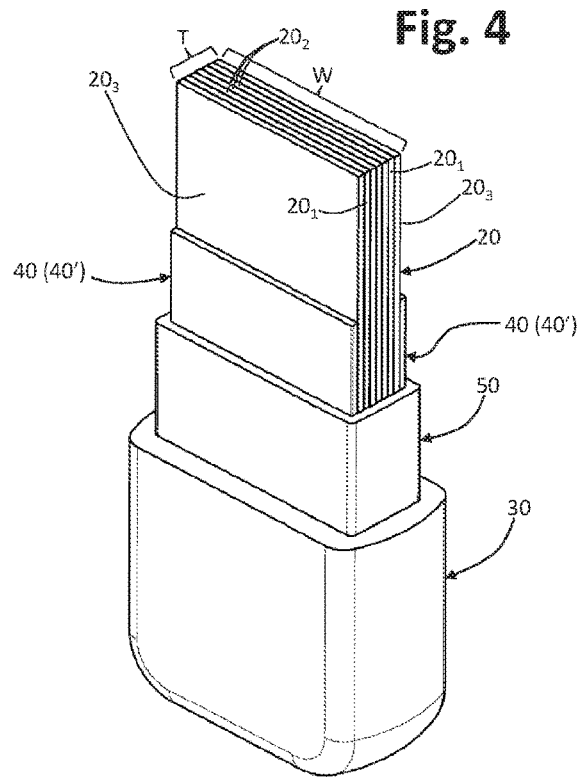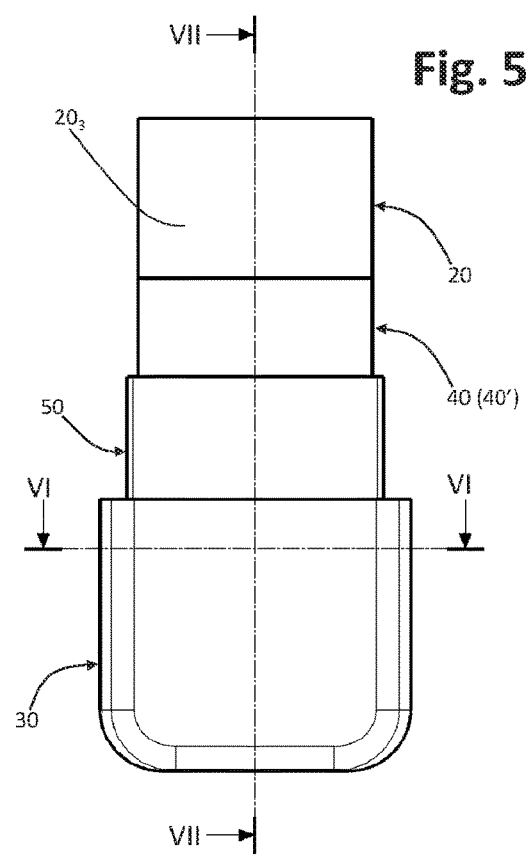

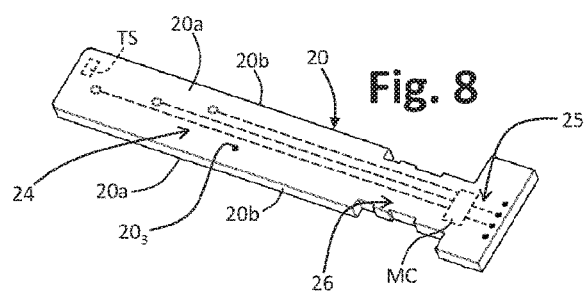
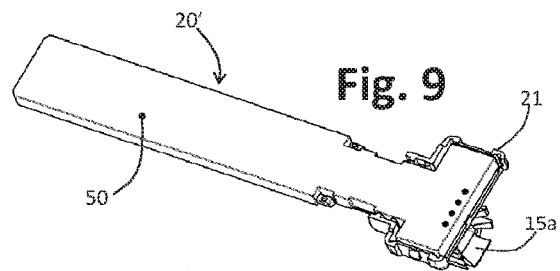
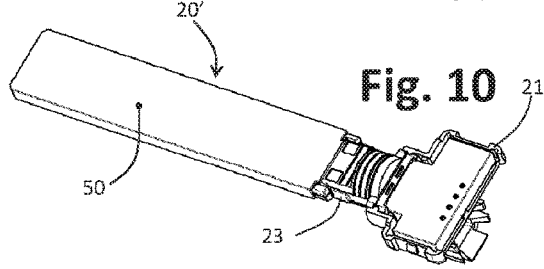
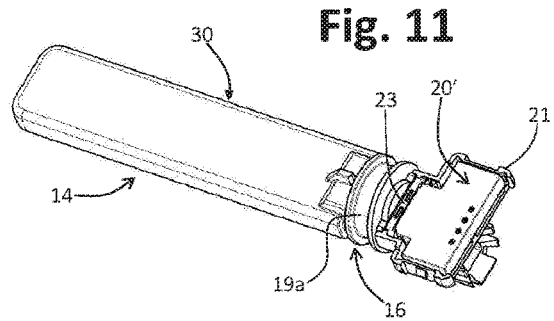
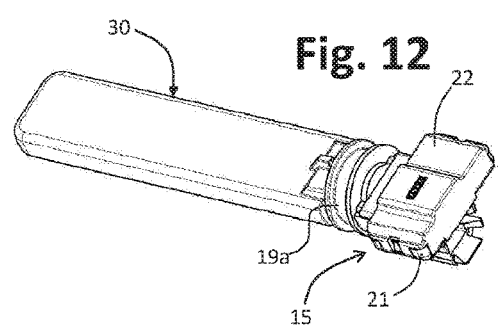

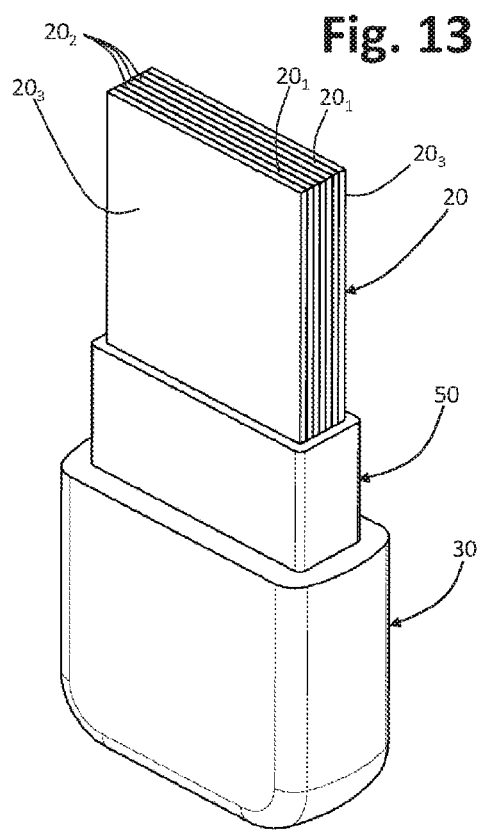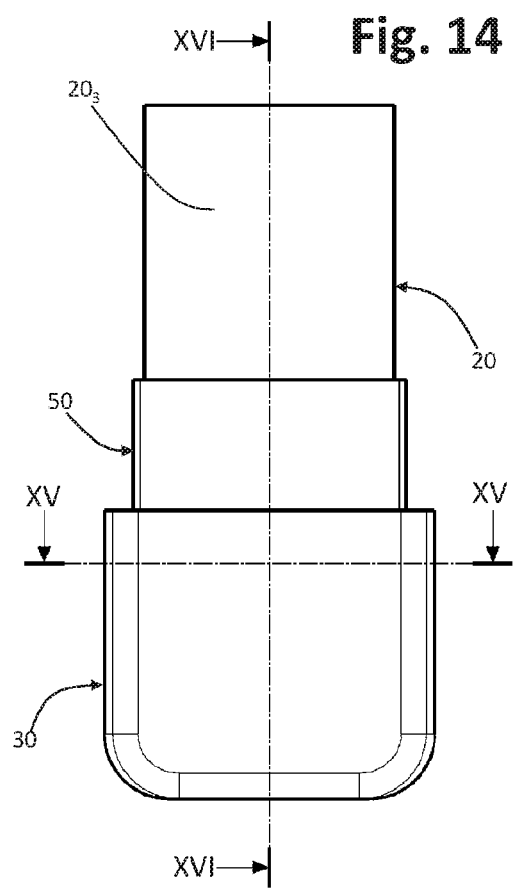

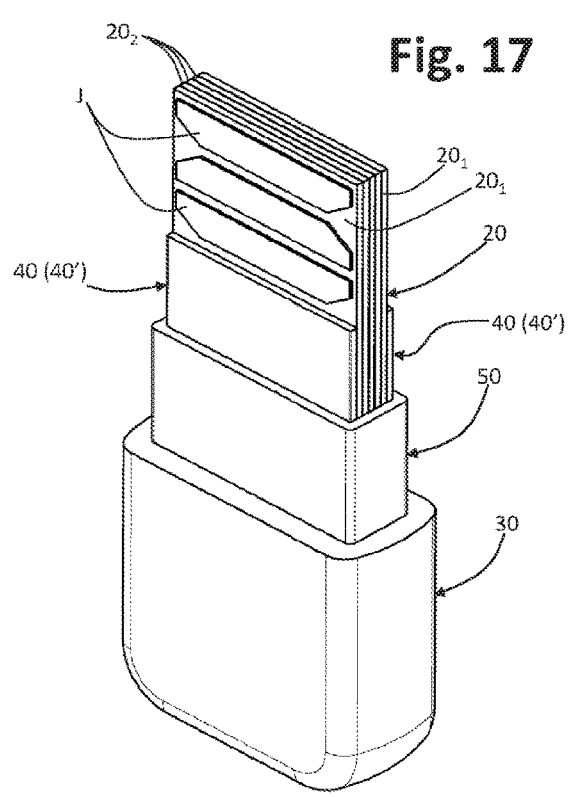
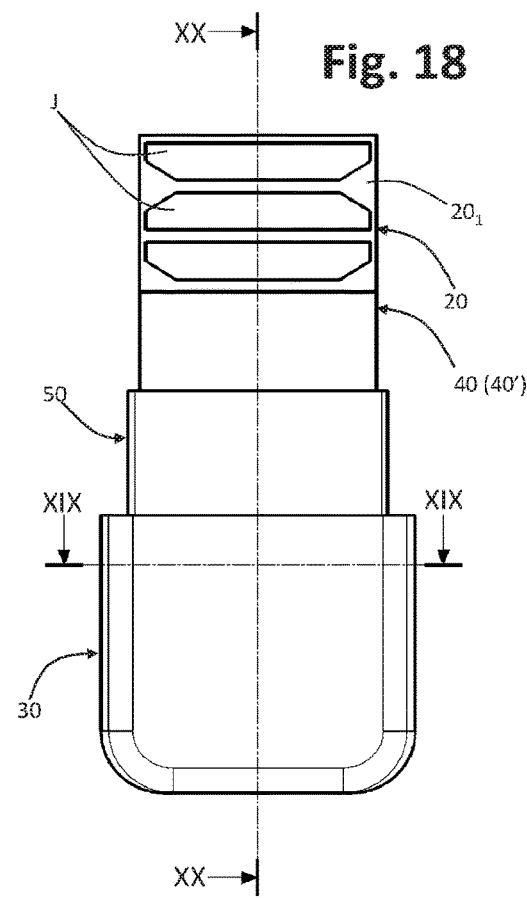

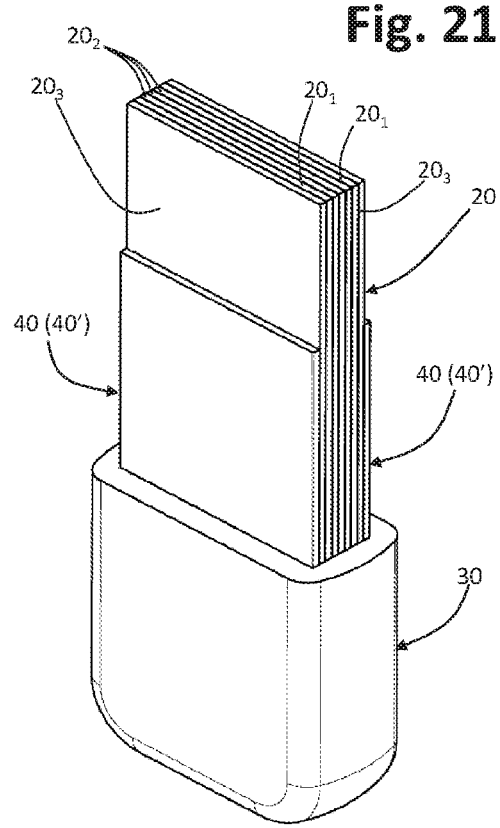
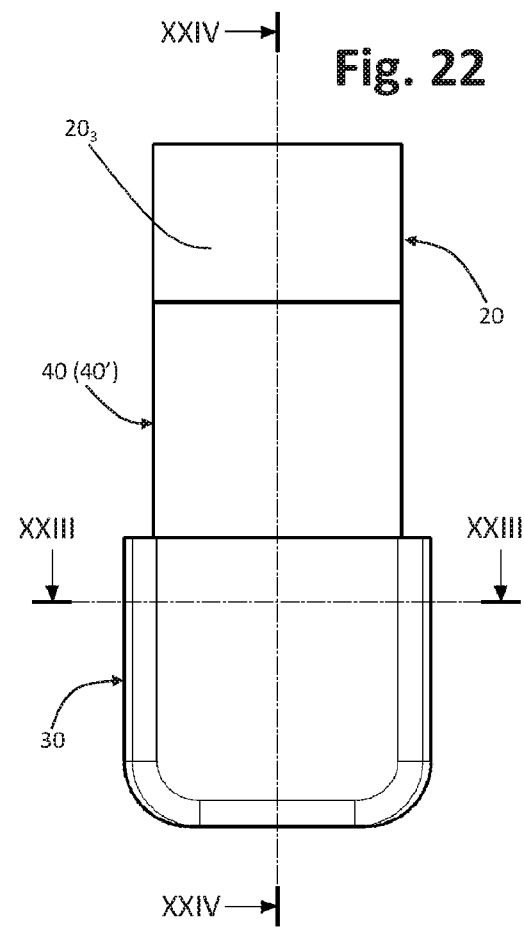

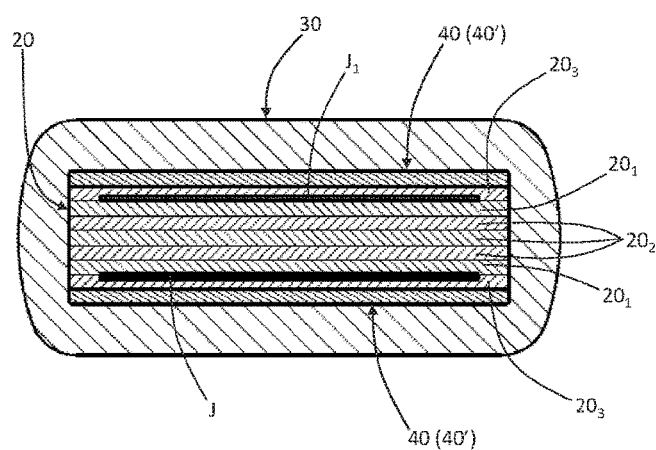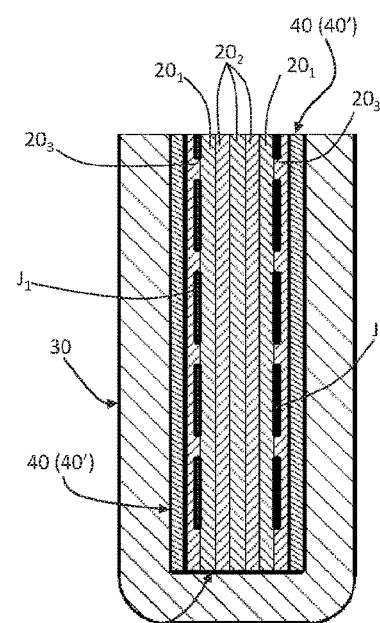

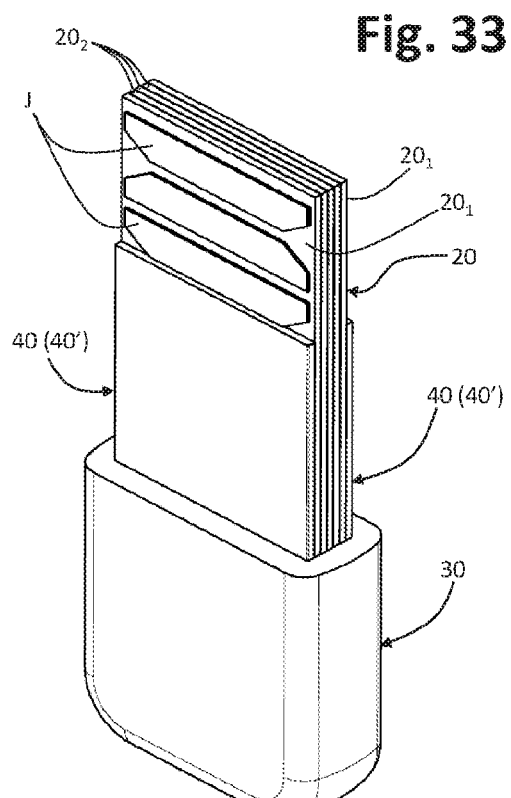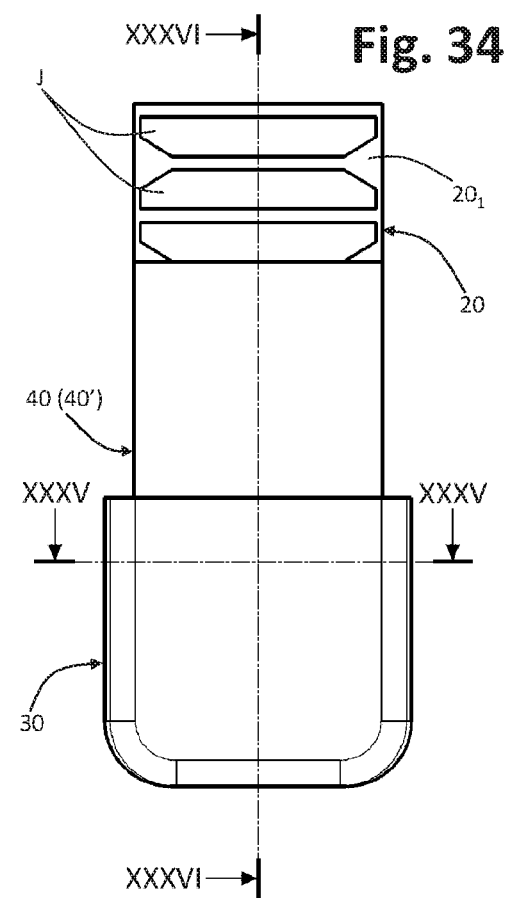

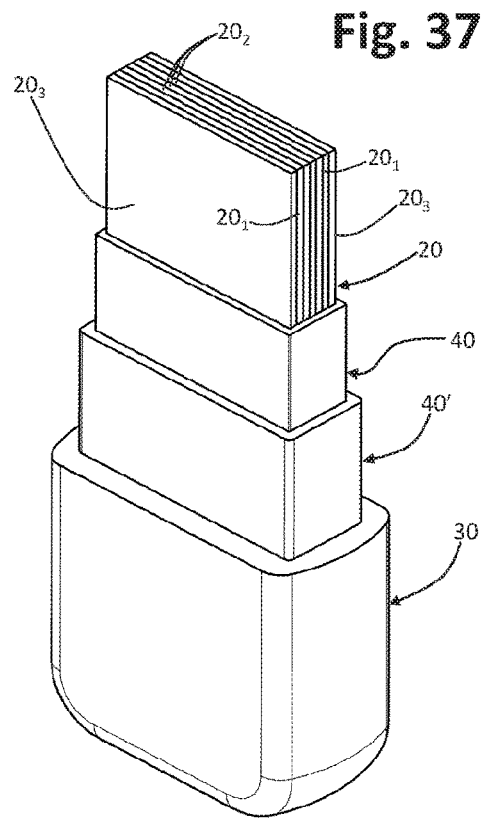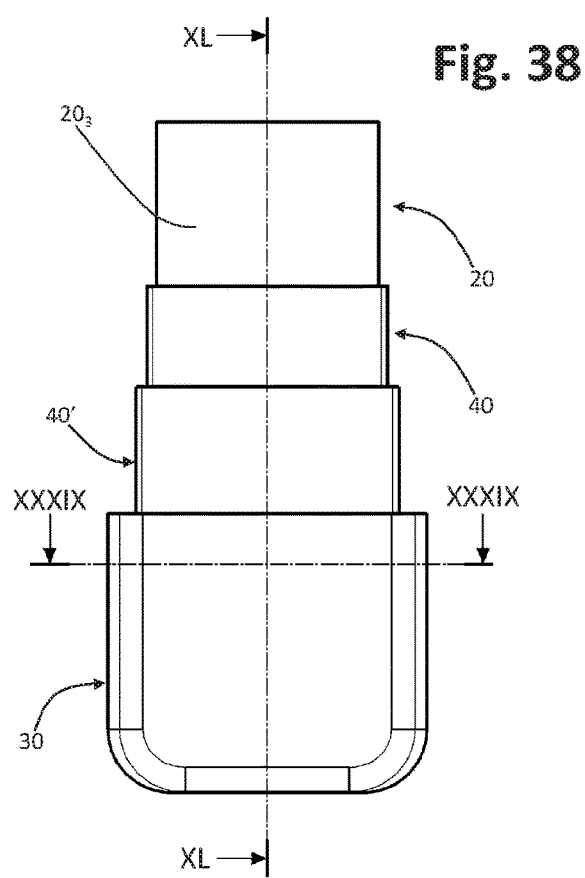

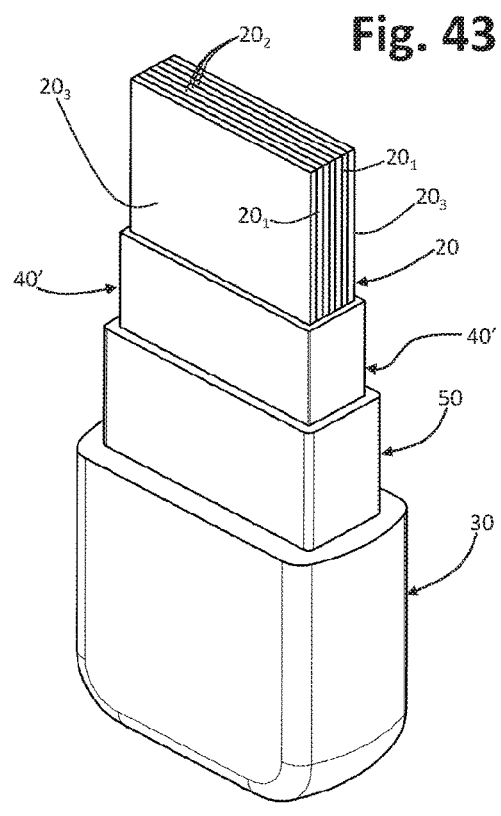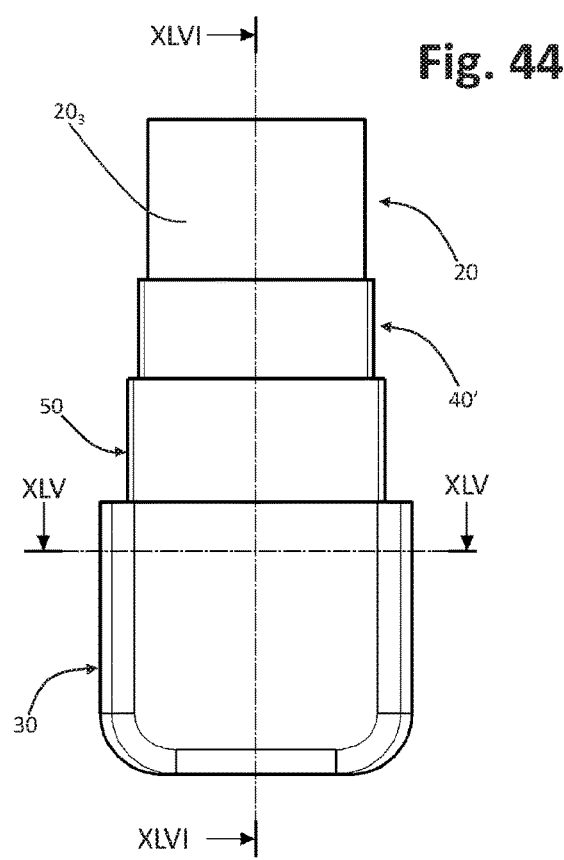

DEVICE FOR DETECTING THE LEVEL OF A MEDIUM

This application is the U.S. national phase of International Application No. PCT/I2018/055201 filed 13 Jul. 2018, which designated the U.S. and claims priority to IT Patent Application No. 102017000082500 filed 20 Jul. 2017, the entire contents of each of which are hereby incorporated by reference.

FIELD OF THE INVENTION

The present invention relates to a sensor device for detecting the level of a generic medium, such as a liquid, a fluid substance, a powdery material, or a material in the bulk state, etc. The invention has been developed with particular reference to level sensors used on vehicles, preferably level sensors of a capacitive type.

PRIOR ART

A level-sensor device of the type referred to is known, for example, from WO 2015/181770 A, filed in the name of the present Applicant. According to a first embodiment, the device disclosed in WO 2015/181770 has a hollow casing, which is to be immersed in the liquid undergoing detection, partially housed within which is a circuit support or PCB (Printed-Circuit Board). The circuit support carries an array of capacitive detection elements, represented by metal electrodes that are substantially the same as one another and are arranged on the support at a distance apart from one another along a level-detection axis. The hollow casing is configured as a distinct component, obtained via moulding of a thermoplastic material, and subsequently inserted therein is a corresponding portion of the circuit support, which carries the detection electrodes. Then introduced in the cavity of the casing is an electrically non-conductive fluid filling material, such as a polyurethane resin or a gel, preferably a silicone gel. The presence of the aforesaid fluid filling material is mainly aimed at preventing the presence of gaps and air pockets within the cavity, in particular in the micro-cavities determined by the roughness in the area of contact between the circuit support, and/or corresponding electrodes, and the casing, which could have an adverse effect on the level measurement (these concepts are clarified also by the details represented in FIGS. 14 and 15 of the document cited, from which it is evident that the support and/or the electrodes is/are in contact with the casing, and the aforesaid fluid filling material does not form an insulating layer).

The above embodiment of the device has as a consequence that the production process must necessarily envisage prior arrangement of the hollow casing, as well as certain specific operations for insertion of the circuit support in the hollow casing and certain specific operations for introduction of the fluid filling material into the cavity of the casing (in addition, obviously, to management of the supplies and movement of the casing bodies and of the filling material).

According to a second embodiment, WO 2015/181770 envisages replacement of the aforesaid hollow casing with an outer coating, formed by direct overmoulding of plastic material on the circuit support. This type of solution simplifies production of the level-sensor device as a whole, but implies in time a decay of its precision of detection, following upon the presence of humidity around the detection electrodes.

The present Applicant has in fact noted that, following upon use of the device, the overmoulded plastic material of the outer coating tends to absorb humidity, on account of the practically constant contact with the liquid undergoing detection. This humidity, the negative effects of which appear with the passage of time, leads to imprecisions of detection already in the course of the service life of the device. The same problem is present also in devices built according to the aforesaid first embodiment of WO 2015/181770, given that its hollow casing is configured for pressing the circuit support against a wall delimited by the corresponding housing cavity so that the electrodes are in strict contact with the wall, which is itself liable to absorb humidity in time.

The sensitivity of the capacitive measurement is maximum if a liquid is set on the surface of the detection electrode and decreases (substantially exponentially) as of the distance between the liquid and the surface of the electrode increases linearly. The same behaviour occurs, however, if, instead of the liquid, water vapour or humidity in general is present. In other words, the presence of humidity in the material of the hollow casing or of the overmoulded coating, and hence on the electrodes in contact with the aforesaid material, has the effect of "emulating" the presence of liquid, thereby vitiating to a certain extent the level-sensing precision.

An overmoulded coating may be formed using a plastic material having good barrier properties and good properties of resistance to humidity. However, materials of this type are in general costly and difficult to process for the purposes of formation of the overmoulded coating (the sensing part of the device is in general rather long, which renders difficult the operation of overmoulding using certain polymers).

The present Applicant has moreover found that certain polymers that present good barrier properties and good properties of resistance to humidity have the drawback of presenting considerable shrinkage, and/or dimensional deformations following upon the moulding operations, and/or on account of expansion and thermal shock. This may cause faults in a circuit support (i.e., in the corresponding electrical paths, and/or electrodes, and/or electronic components) on which such a polymer is directly overmoulded. In any case, also these materials are inevitably subject to absorbing humidity in the long term, following upon prolonged contact with the liquid undergoing detection.

On the other hand, the overmoulded coating may be obtained using other types of plastic materials (for example, certain thermoplastic polymers), which are less expensive and more easily mouldable. These materials in general present, however, poorer characteristics of resistance to humidity, and hence a faster decay of the precision of level sensing by the device.

SUMMARY AND AIM OF THE INVENTION

In view of what has been set forth above, the object of the present invention is to provide a capacitive level-sensor device that is built in a simple and economically advantageous way, but is distinguished by an increased precision, sensitivity, and reliability of detection in the long term, as compared to known devices designed for similar applications. The above and other aims still, which will emerge more clearly hereinafter, are achieved according to the invention by a level-sensor device having the characteristics specified in the annexed claims. The claims form an integral part of the technical teaching provided herein in relation to the invention.

BRIEF DESCRIPTION OF THE DRAWINGS

Further aims, characteristics, and advantages of the invention will emerge from the ensuing description, with reference to the annexed drawings, which are provided purely by way of non-limiting example and in which:

FIGS. 4 and 5 are schematic views, respectively a perspective view and a front elevation, of a level-sensor device according to possible embodiments of the invention;

FIGS. 8-12 illustrate, via schematic perspective views, a possible sequence of assembly of a level-sensor device according to possible embodiments of the invention;

FIGS. 13 and 14 are schematic views similar to those of FIGS. 4 and 5, regarding a level-sensor device according to further possible embodiments of the invention;

FIGS. 17 and 18 are schematic views similar to those of FIGS. 4 and 5, regarding a level-sensor device according to further possible embodiments of the invention;

FIGS. 21 and 22 are schematic views similar to those of FIGS. 4 and 5, regarding a level-sensor device according to further possible embodiments of the invention;

FIGS. 23 and 24 are schematic cross-sectional views according to the lines XXIII-XXIII and XXIV-XXIV, respectively, of FIG. 22;

FIGS. 33 and 34 are schematic views similar to those of FIGS. 4 and 5, regarding a level-sensor device according to further possible embodiments of the invention;

FIGS. 37 and 38 are schematic views similar to those of FIGS. 4 and 5, regarding a level-sensor device according to further possible embodiments of the invention;

FIGS. 43 and 44 are schematic views similar to those of FIGS. 4 and 5, regarding a level-sensor device according to further possible embodiments of the invention.

DESCRIPTION OF PREFERRED EMBODIMENTS OF THE INVENTION

Reference to "an embodiment", "one embodiment", or "various embodiments" and the like, in the framework of the present description is intended to indicate that at least one detail, configuration, structure, or characteristic described in relation to the embodiment is comprised in at least one embodiment. Hence, phrases such as "in an embodiment", "in one embodiment", "in various embodiments", and the like, that may be present in various points of the present description do not necessarily refer to one and the same embodiment, but may instead refer to different embodiments. Moreover, particular conformations, structures, or characteristics defined in this description may be combined in any adequate way in one or more embodiments, even different from the ones represented. The reference numbers and spatial references (such as "upper", "lower", "top", "bottom", "front", "back", "vertical", etc.) used herein, in particular with reference to the examples in the figures, are provided merely for convenience and hence do not define the sphere of protection or the scope of the embodiments. In the present description and in the attached claims, the generic term "material" is to be understood as including also mixtures, compositions, or combinations of a number of different materials. In the figures, the same reference numbers are used to designate elements that are similar or technically equivalent to one another.

Figure 1:
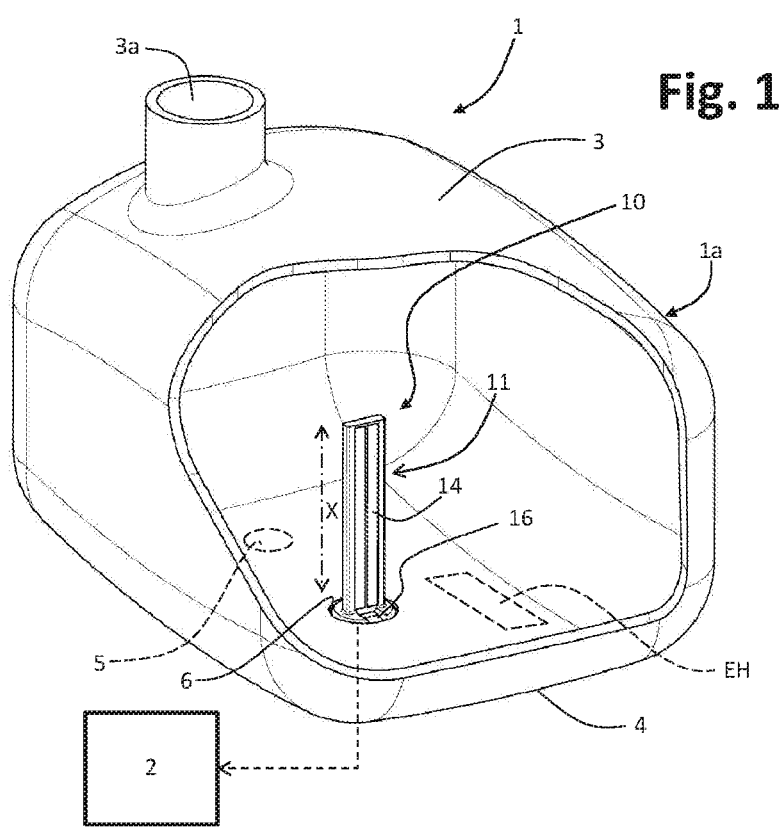
FIG. 1 is a perspective sectioned view of a generic container that comprises a level-sensor device according to possible embodiments of the invention.

In FIG. 1, designated as a whole by 1 is a generic container of a generic substance, in particular a tank of a motor vehicle. The container may, for example, be a tank that is to contain a liquid, for example a fuel, or water, or an additive. In various embodiments, the container 1 (defined hereinafter for simplicity also as "tank") is designed to contain water required for operation of a system of an internal-combustion engine, or else an additive or reducing agent required for the operation of a system for the treatment of the exhaust gases of an internal-combustion engine. Such a system served by the tank 1 is designated by 2. The treatment system 2 may, for example, be an ADI (Anti-Detonant Injection) system, in which case the tank 1 will contain water, or else an SCR (Selective Catalytic Reduction) system, in which case the tank 1 will contain a solution of urea in aqueous solution, such as the one commercially known by the name AdBlue™. In both cases, the liquid is liable to freeze when the tank 1 is exposed to low temperatures (indicatively temperatures lower than 0° C.). For this reason, the tank 1 may be equipped with a heater device. The container 1 could, however, be used for other purposes, and/or in sectors different from the automotive one, and could be designed to contain a different substance.

The main body 1*a* of the tank 1 may be made of any material, in particular a material that is chemically resistant to the substance contained and, preferably, electrically insulating, for example a suitable plastic material according to known technique, such as a high-density polyethylene (HDPE). To the tank 1 there may possibly be associated a heater of a type in itself known, used for heating the tank itself, and/or its contents, for example in the event of freezing. An electrical heater is represented schematically in the figures by the block designated by EH. In various embodiment, one such heater is associated to, or integrated in, a sensor device in accordance with the invention.

In the schematic example illustrated, the tank 1 has an upper part 3, for example an upper wall thereof, where an opening 3a is provided for topping-up of the liquid substance. A lower part 4 of the tank 1, for example, a bottom wall thereof, has an outlet opening 5, via which the solution exits or is drawn out, for example via a pump, for supplying the liquid to the system 2. Also at the lower part 4, the tank 1 has a second opening, designated by 6, at which the body of a sensor device according to various possible embodiments of the invention is sealingly fixed. In various preferred embodiments, in fact, a sensor device according to the invention is to be installed in the lower part of a generic container, in such a way that an outer surface of its body is at least partly in contact with the liquid substance, also when this substance has a very low level in the container.

The sensor device, designated as a whole by 10, includes a level-detection part 11, designed to extend at least partly inside the tank 1, in particular according to a level-detection axis X, which is preferably substantially vertical (but, if need be, it may be inclined with respect to the vertical). Preferentially, a proximal end region of the detection part 11 extends inside the tank 1 at a height relatively close to the bottom wall 4 in order to be able to detect the presence of an even very low level of liquid in the tank. It should be noted that, rather than directly mounted at the opening 6 of the tank 1, the device 10 according to the invention may form, or be associated to, or be integrated in, a further body or component that is sealingly at a different opening of the of the tank 1, for example a component that comprises at least one from among a heater and a pump, possibly shaped to obtain walls of a second container which extends inside the thank 1 and is suitable to contain a part of the liquid present in the tank 1, to a component or module of the type known in the sector as .UDM (Urea Delivery Module), or else a component designed to prevent sudden variations of the level of the liquid during movement of the vehicle.

Figure 2:
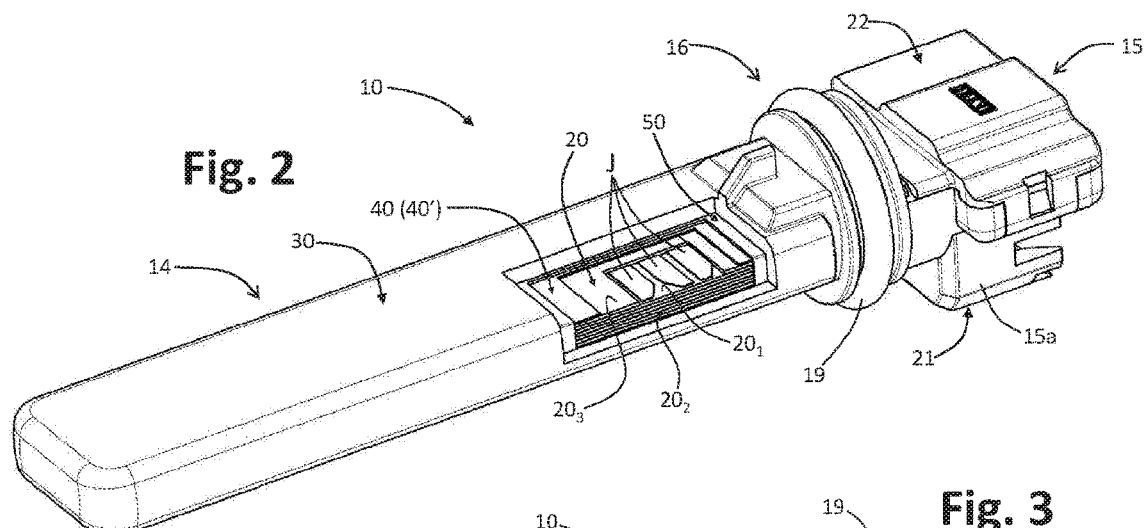
FIG. 2 is a partially sectioned schematic perspective view of a level-sensor device according to possible embodiments of the invention.
Figure 3:
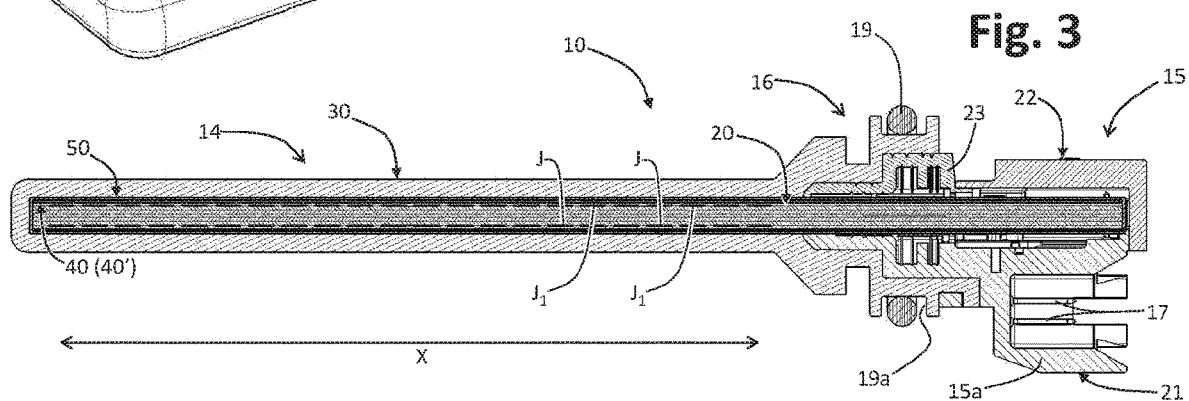
FIG. 3 is a schematic longitudinal section of a level-sensor device according to possible embodiments of the invention.
Figure 6:
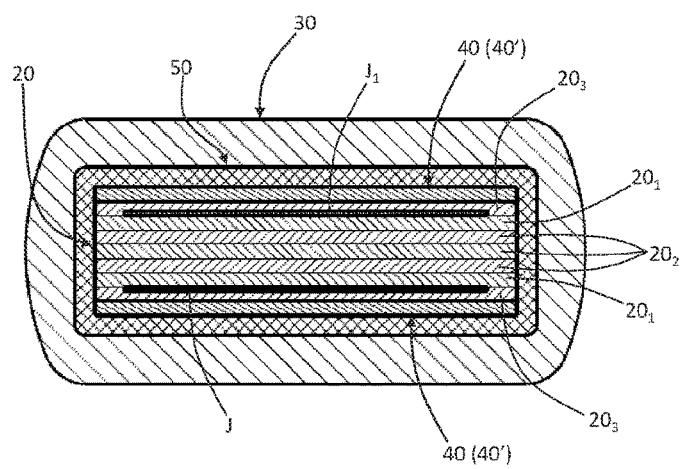
FIGS. 6 and 7 are schematic cross-sectional views according to the lines VI-VI and VII-VII, respectively, of FIG. 5.
Figure 7:
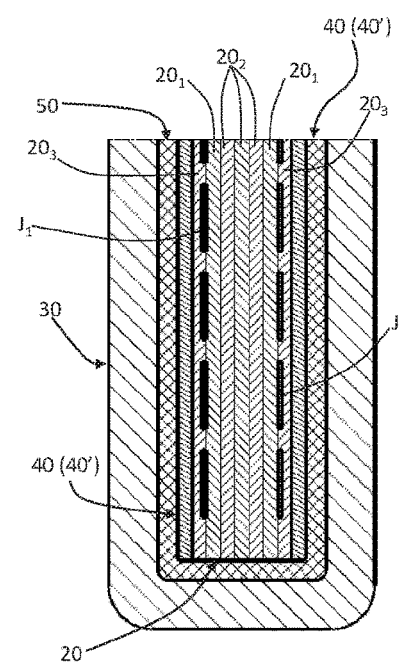
Figure 15:
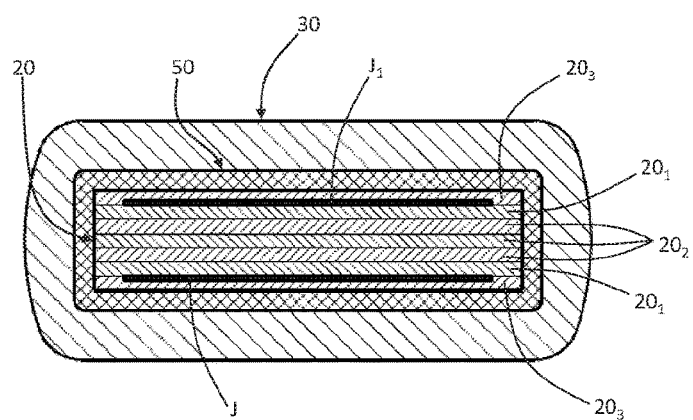
FIGS. 15 and 16 are schematic cross-sectional views according to the lines XV-XV and XVI-XVI, respectively, of FIG. 14.
Figure 16:
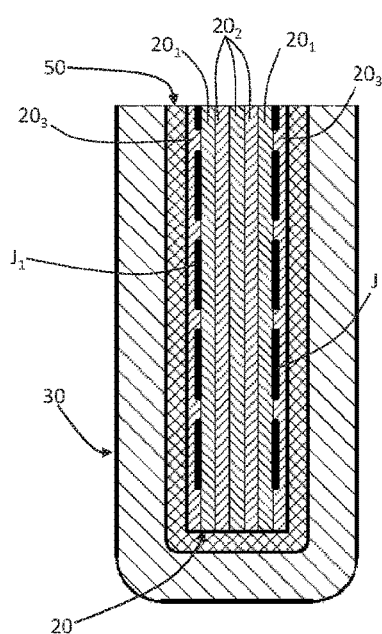
Figure 19:
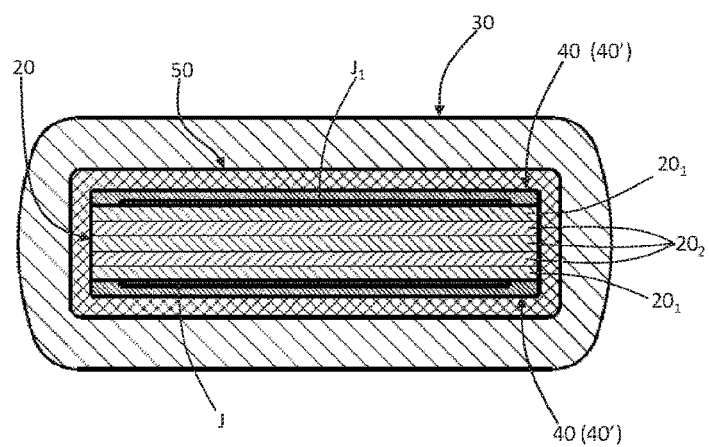
FIGS. 19 and 20 are schematic cross-sectional views according to the lines XIX-XIX and XX-XX, respectively, of FIG. 18.
Figure 20:
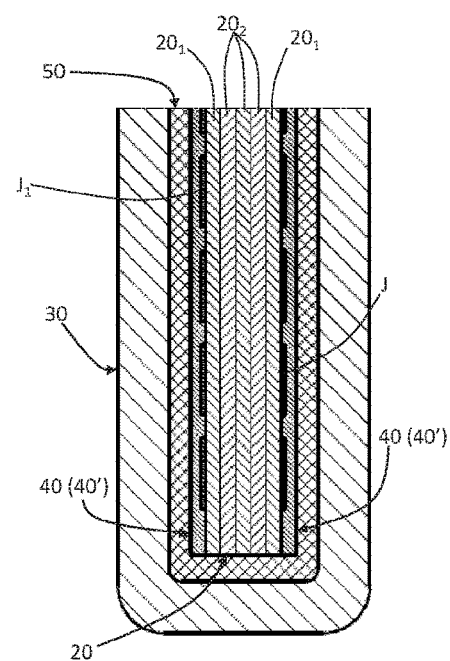
Figure 25:
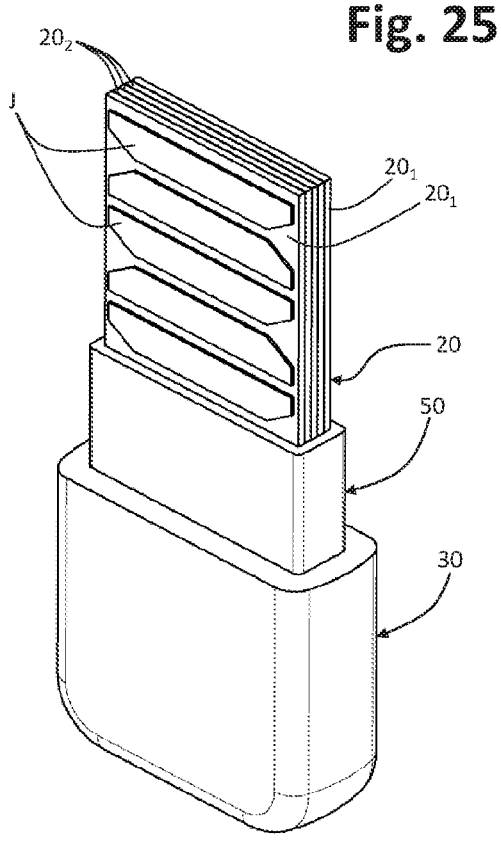
FIGS. 25 and 26 are schematic views similar to those of FIGS. 4 and 5, regarding a level-sensor device according to further possible embodiments of the invention.
Figure 26:
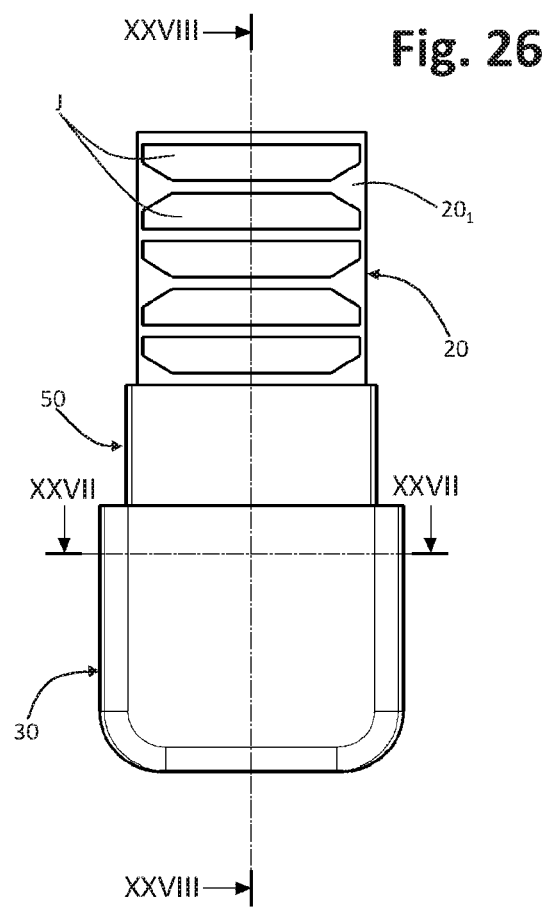
Figure 27:
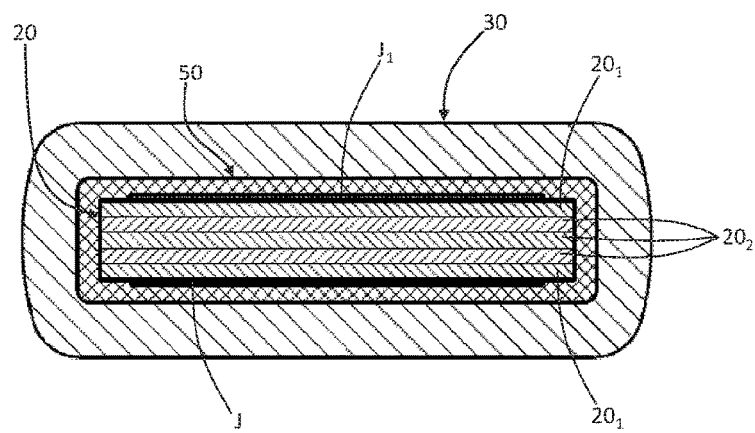
FIGS. 27 and 28 are schematic cross-sectional views according to the lines XXVII-XXVII and XXVIII-XXVIII, respectively, of FIG. 26.
Figure 28:
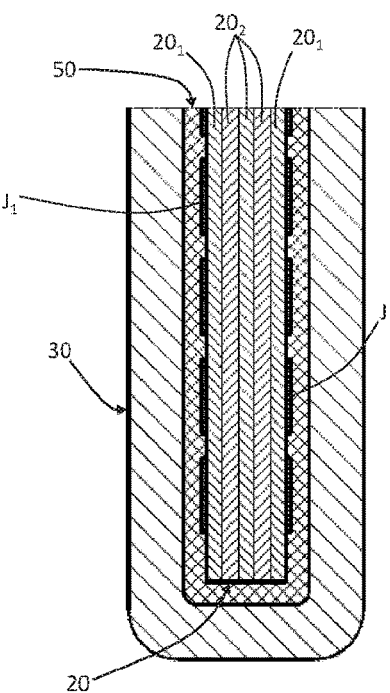
Figure 29:
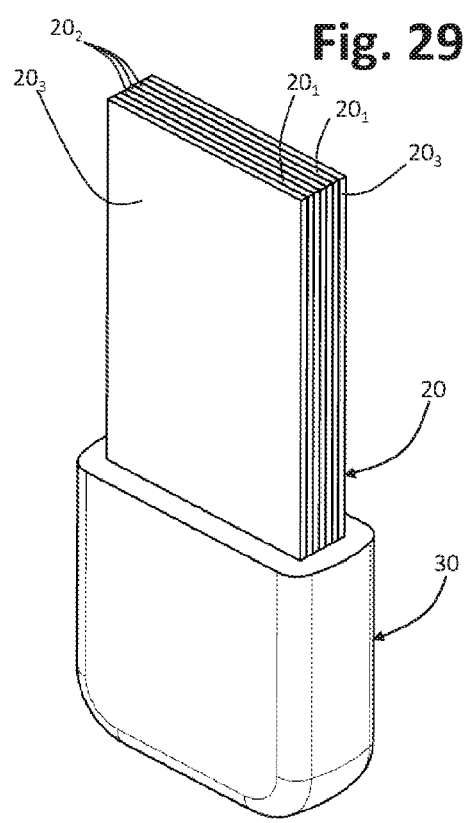
FIGS. 29 and 30 are schematic views similar to those of FIGS. 4 and 5, regarding a level-sensor device according to further possible embodiments of the invention.
Figure 30:
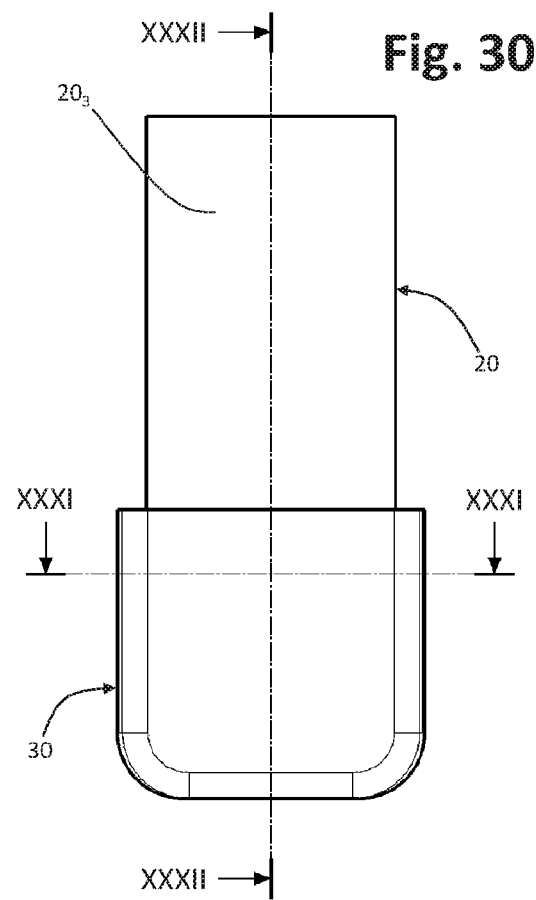
Figure 31:
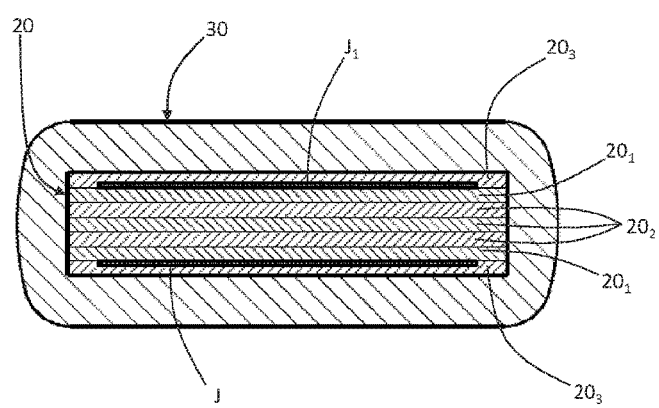
FIGS. 31 and 32 are schematic cross-sectional views according to the lines XXXI-XXXI and XXXII-XXXII, respectively, of FIG. 30.
Figure 32:
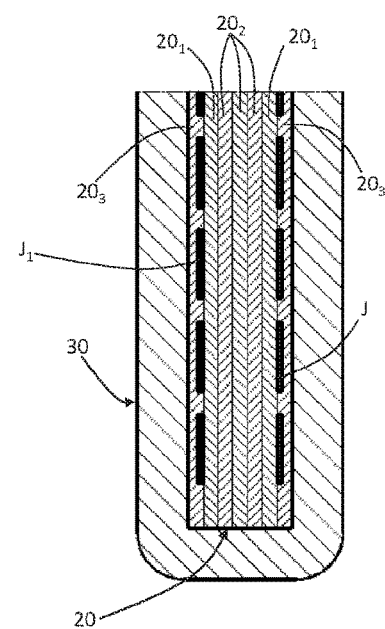
Figure 35:
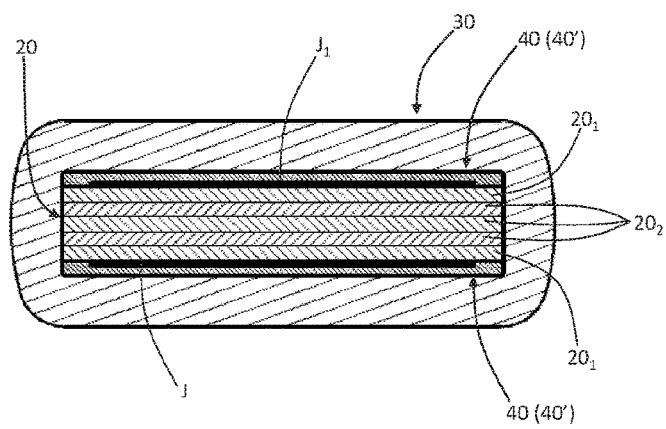
FIGS. 35 and 36 are schematic cross-sectional views according to the lines XXXV-XXXV and XXXVI-XXXVI, respectively, of FIG. 34.
Figure 36:
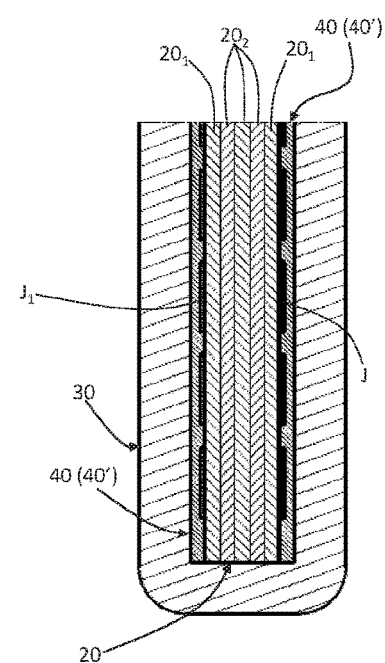
Figure 39:
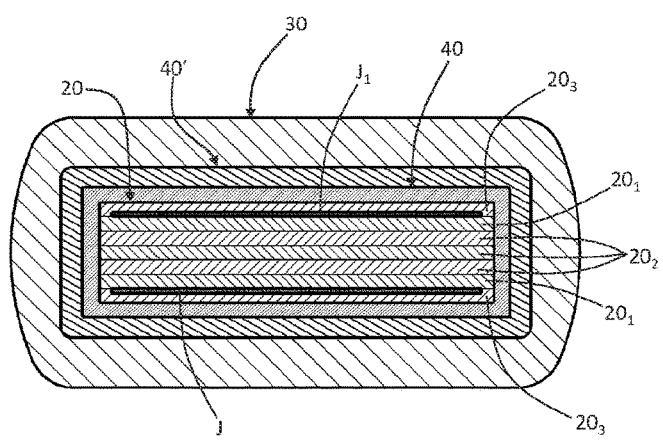
FIGS. 39 and 40 are schematic cross-sectional views according to the lines XXXIX-XXXIX and XL-XL, respectively, of FIG. 38.
Figure 40:
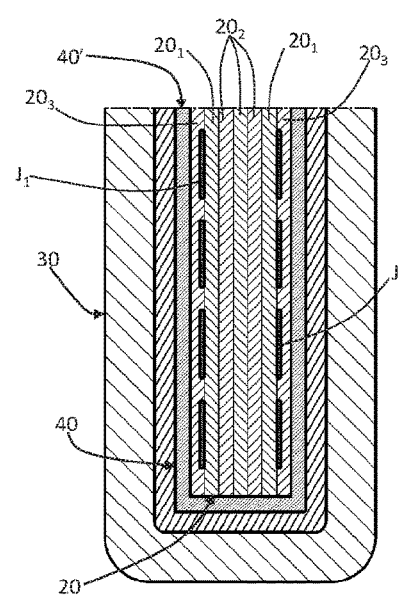

In FIGS. 2 and 3, a device 10 according to possible embodiments is represented in isolation, via a perspective view partially sectioned and a view in longitudinal section. The device 10 has a casing body that comprises at least one detection portion 14, which is electrically insulating and fluid-tight and which prevalently belongs to the detection part 11 of the device 10 (FIG. 1).

In various embodiments, the casing body of the device also comprises:
  a connection and/or control portion 15 (hereinafter referred to for simplicity as "connection portion"), for electrical connection of the device 10 to an external system, for example, a control unit belonging to the system 2 of FIG. 1, and
  a mounting portion 16, which is configured for sealed coupling and/or positioning of the device 10 on a different device, for example at the opening 6 of the tank of FIG. 1.

In various embodiments, the connection and/or control portion 15 includes a generally hollow connector body 15a, extending in which are respective portions of electrical terminals, partially visible in FIG. 3, where they are designated by 17. In various embodiments, the terminals 17, for example obtained via stamping or blanking from metal strap, form, with the connector body 15a, an interface for external connection of the device 10, for example to the aforesaid control unit of the system 2. Preferentially, each terminal 17 has a contact portion, preferably a lamina portion, designed for being positioned within the cavity of the connector body 15a, and an interconnection portion, which is preferably narrow, designed for electrical and mechanical coupling with respective contact elements, for example present on a circuit support or substrate described hereinafter.

In various embodiments the mounting portion 16 extends axially between the detection portion 14 and the connection and/or control portion 15 and has, at an outer peripheral surface thereof, at least one seat 19a for an annular sealing element, such as an o-ring gasket, which may performs possibly also function of elastic mounting of the device 10, for example with respect to the tank 1 onto which the device is mounted.

It should be noticed that, in various embodiments, particularly those in which a sensor device in a accordance with the invention is integrated or designed to be coupled with a different functional component (such as for example an UMD module or an ADI module), the detection portion 14 may belong to a housing body of such a functional component, whereas the connection portion 15 and/or the mounting portion 16 may be omitted, or at least in part defined by the housing body of the aforesaid functional component.

Partially visible in FIGS. 2 and 3 is also a circuit support or PCB (Printed Circuit Board), designated as a whole by 20, which extends at least in the detection portion 14 of the casing body of the device, and preferably also in the mounting portion 16 and in the connection and/or control portion 15.

In these figures, designated by 21, 22 and 23, are three body parts, which are to be joined together with interposition of a proximal end portion of the PCB 20.

In the example of FIG. 3, the parts 21 and 22 form at least partially the connection portion 15 of the casing body, with the part 21 that preferentially defines the connector body 15a and integrates the electrical terminals 17. Again with reference to the example shown in FIG. 3, the same part 21 forms, together with the part 23 and a part of an overmoulded coating (30), at least one part of the mounting portion 16. Portions 15 and 16 of the casing body of the device 10 could also be formed in some other way, for example with at least some of parts 21, 22, 23 and/or of portions 15 and 16 made of the same material as the aforesaid overmoulded coating and/or as integral part of coating, thereby possibly comprising inventive characteristics described with reference to the detection portion.

The detection portion 14, and preferably but not necessarily at least one part of the mounting portion 16, comprises/comprise an overmoulded outer coating 30, which is made of a first electrically insulating material. This outer coating 30, i.e., the material that forms it, defines an outer surface of the casing body of the device 10, which is designed to be in contact with the medium or substance the level of which has to be detected.

Provided on the PCB 20 is at least part of the necessary electrical-connection elements (such as leads or electrical paths), and/or of the electrical and/or electronic componentry necessary for level detection. The PCB 20 has a load-bearing structure, or supporting structure, made of electrically insulating material, suitable for producing printed circuits. In various embodiments, the PCB 20 is formed using at least one composite material that includes glass fibres, i.e., silicon oxide, preferably a composite material having a matrix of epoxy resin, in which glass fibres are included, where the glass fibres are arranged to form a sort of non-woven fabric impregnated with the resin. Materials that are preferred in this sense are for example FR4, vetronite, and similar electrically insulating composite materials, such GRP (Glass-Reinforced Plastic). On the other hand, as will be seen hereinafter, not excluded from the scope of the invention is the use of other materials for obtaining the supporting structure of the PCB 20, such as ceramic or polymer-based materials, not necessarily composites, and/or materials including silicon or its derivatives or compounds.

The PCB 20 extends longitudinally between two ends along the level-detection axis X and has a generally flattened shape, which includes two opposite major sides (designated by 20a only in FIG. 8), which define between them a PCB thickness T (indicated only in FIG. 4), and two opposite longitudinal edges (designated by 20b only in FIG. 8), which define between them a PCB width W (indicated only in FIG. 4).

In the PCB 20—represented in isolation in FIG. 8—it is possible to identify a detection region 24, which belongs to the detection part 11 of the device 10 and includes the distal end of the PCB itself, as well as a second region 25, hereinafter also defined for simplicity as "control and/or connection region", which includes the proximal end of the PCB. Between the two regions 24 and 25 there may possibly be provided also an intermediate region, such as the one designated by 26 in FIG. 8, in particular designed to be in a position corresponding to the mounting portion 16 of the casing body of the device 10.

To the region 25 of the PCB 20 there may be associated at least part of the electrical and electronic processing and/or control componentry of the device 10, and associated thereto are the terminals 17 (FIG. 3) for external electrical connection of the device 10. Instead, associated prevalently to the region 24 of the PCB 20 is the level-detection componentry. More in particular, associated to the region 24 is at least one first array of capacitive elements, which comprises at least one first series of first electrodes in a position corresponding to a major side of the PCB (for example, the major side hereinafter identified by a layer 20₃ or a layer 20₁, according to the embodiment considered). It should be noted that phrases such as "in a position corresponding to a major side" or "at a major side" used with reference to the electrodes, and present also in the sequel of the present description and in the attached claims, do not necessarily imply that the electrodes referred to are arranged on the outside of the aforesaid side, i.e., on an outer face thereof. In various preferred embodiments, in themselves autonomously inventive, the PCB 20 is a PCB of a so-called multilayer type, i.e., a circuit support having a multilayer supporting structure that comprises a plurality of layers of electrically insulating material, for example laminated on one another, with the aforesaid electrodes that are arranged between two layers of electrically insulating material of the structure.

In traditional multilayer PCBs, defined on one or more of the intermediate layers are corresponding electrically conductive paths, and possibly also other active and/or passive components of an electrical circuit arrangement, which are then "enclosed" within the multilayer structure, the paths and/or circuit components present on one layer being possibly electrically connected to paths and/or circuit components present on another layer via so-called metallized "vias" or holes.

According to an inventive solution proposed herein, used in the level-sensor device is a multilayer PCB 20 that integrates inside it at least one first array of first electrodes used for capacitive level detection, i.e., in such a way that at least one layer of the multilayer structure of the PCB 20 is set between the aforementioned first electrodes and the overmoulded material of the outer coating. Such a case is exemplified in FIGS. 2-3, where some of the aforesaid first detection electrodes are designated by the letter "J" (in FIG. 8 these electrodes are not visible in so far as they are covered by an outer layer 20₃ of the PCB 20). According to variants not represented, the various configurations described with reference to multilayer circuit supports or PCBs with internal electrodes could be obtained also in some other way, not necessarily envisaging a support with a number of layers, for example, envisaging a plurality of electrodes and electrically conductive paths, such as shaped metal straps, then overmoulded with an electrically insulating polymer that provides the supporting structure for the electrodes and other circuit elements (conductive paths, metallized holes or vias, electrical and/or electronic components, etc.). As will be seen, in any case, according to other embodiments, the PCB 20 is preferably of a multilayer type, and/or its detection electrodes may be arranged on the outside of at least one of its sides, preferably at least one of its major sides.

In various embodiments, the electrodes J of the aforesaid first array are substantially the same as one another and are set at a distance apart from one another along the level-detection axis X, in a predefined and preferably homogeneous way. According to possible embodiments (not illustrated), however, one and the same array of capacitive elements may also include a number of different series of electrodes, the electrodes of one series having a geometry different from that of the electrodes of another series of the same array. In other embodiments, the electrodes could have a shape elongated in the direction of the level-detection axis X.

In various preferred embodiments the sensor 10 also comprises a second array of second capacitive elements on the detection region 24 of the PCB 20, wherein such a second array comprises at least one second series of second electrodes, preferably being substantially the same as one another, coplanar and spaced apart from each other along the level-detection axis X, and which are arranged in a position corresponding to the second major side of the PBC 20. This characteristic can be appreciated for example from FIG. 3, wherein some of the aforesaid second electrodes are designated by The invention will be described hereinafter with reference to the case represented, i.e., a PCB including two arrays of electrodes J and J₁: however, in accordance with non-represented embodiments, the PCB can includes a single array of electrode, in a position corresponding to any one of the sides thereof.

In the example shown in FIG. 3, the first electrodes J and the second electrodes J₁ are in substantially mirrored or mutually-aligned positions (i.e., non staggered positions), with reference to the two opposite major sides of the PCB 20: however, in other embodiments not represented herein, the second electrodes J₁ are in staggered positions with respect to first electrodes J, with reference to the level-detection axis X: variants of this kind enable to increase the resolution of measure of the level of the device 10; to this purpose, it is preferable that the electrodes J₁ extend in intermediate positions with respect to the electrodes J, and vice-versa, such that electrodes $J_1$ enable to detect levels which are intermediate to those detectable by the dei electrodes J.

In various embodiments the electrodes J and $J_1$ are connected individually to respective inputs of a controller—represented schematically in FIG. 8, where it is designated by MC—that belongs to the control circuitry and that, for example, is positioned in the region 25 of the PCB 20. Not excluded, however, is the case of connection of a number of electrodes J and/or $J_1$ in parallel to one another to one and the same input of the aforesaid controller. Preferably, the electrodes J and $J_1$ have geometrical shapes that are the same as one another, or else have different shapes but the same surface dimensions or, in general, have the same electrical capacitance. The electrodes J and/or $J_1$ extend preferentially in a direction transverse to the PCB 20 or to the level-detection axis X.

The electrodes J and $J_1$ are made of electrically conductive material, for example a metal material or a metal alloy. The electrodes J and $J_1$ are preferably coplanar with respect to one another, within the corresponding array, and may, for example, be in the form of plates or laminas sunk in or applied on the supporting structure of the PCB 20, or else may be constituted by an electrically conductive layer deposited on the supporting structure of the PCB 20, for example using a silk-screen printing technique or the like. In various embodiments, the PCB 20, or at least one of its layers, has vias or through holes containing electrically conductive material, for electrical connection of the electrodes J and $J_1$ together, and/or to corresponding conductive connection paths, and/or to possible other electrical and/or electronic components present in the PCB 20.

The region 25 of the PCB 20 is preferably comprised between the proximal end of the PCB itself and the first electrode J or $J_1$ of the corresponding array (in this perspective, the connection and/or control region 25 may hence include also the area corresponding to the intermediate region designated by 26 in FIG. 8). However, also included in the scope of the invention is the case where electrical and/or electronic control and/or processing components belonging to the circuit arrangement of the device 10 are arranged along the entire PCB 20 or within its detection region 24, i.e., in the proximity of, and/or between the electrodes J and/or $J_1$. In this perspective, the connection and/or control region 25 may extend even substantially throughout the length of the PCB 20, with a part thereof in common with the detection region 24. As has been said, in particular in the case of a PCB 20 of the type exemplified, i.e., having a multilayer structure, also at least some of the aforesaid electrical and/or electronic control and/or processing components may be arranged between two layers of electrically insulating material of the multilayer structure.

As already mentioned, in various embodiments, the components belonging to the measurement circuit arrangement that equips the device 10 include at least one control unit or controller MC (for example, selected from, or comprising at least one from among, a microcontroller, a microprocessor, a CPU, a DSP—Digital-Signal Processor, a memory, an integrated circuit, an operational circuit, an A/D converter circuit, an electronic switching circuit), as well as further active and/or passive components (such as transistors, MOSFETs, resistors, capacitors, diodes, etc.).

In various embodiments, the controller MC has a plurality of inputs to which the electrodes J and $J_1$ are connected individually, or else a number of electrodes J and/or $J_1$ in parallel to one another are connected to one and the same input of the controller MC. The controller MC preferably comprises at least one processing logic unit, a memory, and inputs and outputs, amongst which inputs of an analog/digital type. The controller MC may, for example, be a microprocessor identified by the code PIC16F1517 manufactured by Microchip Technology Inc. or a microprocessor identified by the code of the series CY8C4200M manufactured by Cypress Semiconductor Corporation. The specific level-detection modalities implemented by the device 10 by means of the electrodes J and/or $J_1$, of a capacitive type, may, however, be of any type known in the sector, for example according to the teachings of any of documents WO2015/181770, WO2016/042456, and WO2016/042459 filed in the name of the present Applicant.

As has been mentioned, provided in the PCB 20 are electrically conductive paths, for connection of various circuit elements, such as the electrodes J and $J_1$, the possible further electrical and/or electronic components, and the terminals 17 (some of these paths are represented schematically in FIG. 8 via dashed lines that depart from the controller MC). As has been said, the PCB 20 may present also metallized vias or holes (represented schematically by dashed circles in FIG. 8), for connecting together different conductive paths, and/or for connecting conductive paths and/or circuit components provided in different layers or parts of the PCB 20, to the outside world and/or internally. As has been said, in fact, in various preferential embodiments, the PCB 20 is a PCB with multilayer supporting structure, where the aforesaid paths may be provided on internal or intermediate layers of the PCB itself.

In various embodiments, the sensor device according to the invention includes at least one further sensor means for detecting at least one further quantity different from the level of a substance. The further sensor means may, for example, be selected from temperature sensors, pressure sensors, quality sensors, sensors designed to detect characteristics of composition and/or chemico-physical characteristics of the fluid (such as an optical-type sensor). For instance, in various embodiments, the circuit arrangement of the device 10 includes at least one temperature sensor, in particular a sensor with temperature-variable electrical resistance, such as a sensor of an NTC or PTC type. Such a sensor may be mounted in a position corresponding to at least one from among the proximal end area, the distal end area, and an intermediate area of the detection region 24 of the PCB 20. One such temperature sensor is represented schematically by block TS in FIG. 8.

According to one aspect, the present invention proposes distancing or spacing apart the detection electrodes J or $J_1$ of a respective array (are at least the surface thereof facing towards the medium the level of which is to be measured) from the material that forms the overmoulded outer coating 30: according to an inventive aspect, this measure enables to prevent or delay the electrodes from being reached by humidity of the liquid subject to level detection, which with the passing of time is absorbed by the overmoulded material that is in contact with the same liquid.

Based on the aforesaid aspect of the invention, between the overmoulded outer coating 30 and the electrodes J and $J_1$ of a respective array, there is set at least one intermediate layer made of an electrically insulating and substantially impermeable material, which di different from the material forming the coating 30, wherein the at least one intermediate layer is obtained before overmoulding of the coating 30.

In preferred embodiments, the at least one intermediate layer between the overmoulded coating 30 and the electrodes J and $J_1$ comprises a layer of material including silicon (or its derivatives or compounds), i.e., a material that is practically insoluble in water and unattackable by acids. Among such materials of particular interest is, for example, silica, i.e., silicon oxide (silicon dioxide), which can provide an impermeable vitreous intermediate layer.

In view of the application proposed herein, preferred precursors for synthesis of silica films or layers are silazanes, and in particular polysilazanes, i.e., polymers the skeleton of which is constituted by silicon atoms bridged by nitrogen atoms. Alternatively, for the application proposed herein, as precursors for the synthesis of silica films or layers other compounds could be used comprising silica ($SiO_2$), preferably in liquid or powder form, possibly in the form of silicon-dioxide or silica powder dispersed in a liquid, in particular in the form designed to be deposited on a PCB and/or coat at least part of the PCB.

The length of the Si—N bond is in general estimated between 1.70 and 1.75 Å, whereas the bond angle depends upon the silicon and nitrogen substituent groups. On account of the polarity of the Si—N bonds and of the basicity of nitrogen, polysilazanes are particularly reactive in regard to hydrolysis in the presence of water (or protic solvents, such as alcohols or acids). These reactions cause breaking of the bond between silicon and nitrogen and quickly lead to formation of silica and ammonia. A particularly promising precursor in this sense is perhydropolysilazane (PHPS), which is constituted by silicon, nitrogen, and hydrogen and the structure of which resembles a three-dimensional lattice, where the silicon atoms are connected together via nitrogen bridges.

Perhydropolysilazane, like other polysilazanes, may be used, together with at least one organic solvent and at least one catalyst, as base for obtaining liquid compositions that can be applied at room temperature on generic non-absorbent surfaces. Following upon application of such a liquid composition, a permanent barrier layer substantially made of vitreous silica is formed, which chemically binds to the substrate at room temperature and polymerises with the humidity present in the air. Compositions of this type are commercially available from various manufacturers and are traditionally used for protecting outer surfaces of means of transport or structures made of wood.

For the purposes of application of the aforesaid composition, the substrate of interest—here the PCB 20—must be previously cleaned, devoid of grease or oily substances, and dry. The application temperature is preferentially comprised between +5° C. and +30° C., with a relative humidity comprised between 30% and 80%. The solution may be applied on the PCB 20 in the form of layer, for example via spraying or else dipping the PCB itself in a container containing the liquid solution, i.e., using a dip-coating technique. Practically complete polymerisation may be obtained at room temperature, usually after approximately 8 to 12 h from application (completion of polymerisation occurs after approximately 7 days at room temperature). Not on the other hand excluded from the scope of the invention is a step of thermal treatment to speed up polymerisation. After polymerisation, the layer applied is transparent, substantially having the appearance of a thin layer of glass.

In addition, and/or as an alternative, the at least one intermediate layer between the overmoulded coating 30 and the electrodes J and $J_1$ may comprise a layer of composite material that includes silicon, or its derivatives or compounds, for example, silicon oxide. A substantially impermeable composite material of this type may have, for example, a matrix having a base of epoxy resin supplemented with glass-fibre fillers.

In various embodiments the at least one intermediate layer between the overmoulded coating 30 and the electrodes J and $J_1$ comprises at least two different layers of material, each of which including silicon, or its derivatives or compounds. The aforesaid two layers may be two layers prevalently comprising vitreous silica, obtained starting from a polysilazane-based liquid solution, as referred to above. In other embodiments, the at least one intermediate layer comprises a first layer of material including vitreous silica, obtained starting from a polysilazane as referred to above, and a second layer of composite material of the type referred to above, for example including glass fibre. In various preferential embodiments, the aforementioned second layer of composite material is in a position intermediate between the first layer of material and the electrodes J, $J_1$.

In other embodiments still, the at least one intermediate layer comprises at least two different layers of material, of which a first intermediate layer including silicon, or its derivatives or compounds, and the other intermediate layer—on which the material of the coating 30 is designed to be overmoulded—which is made of a polymer that is less stiff, i.e., more flexible, than the material of the first layer, for example a substantially impermeable polymer containing fluorine derivatives or compounds.

In various embodiments, the at least one intermediate layer comprises at least one material or polymer that is at least in part flexible, or deformable, or compressible, such as a fluoropolymer or an elastomer, on which the material of the coating 30 is designed to be overmoulded, where preferably the coating 30 is made of a polymer that is stiffer than the material of the aforementioned intermediate layer.

Between the overmoulded outer coating 30 and the electrodes J and/or $J_1$ there may be set at least one intermediate layer made of an electrically insulating and substantially impermeable material that does not include silicon or its compounds. In particularly advantageous embodiments, this material is a polymer containing fluorine or its derivatives or compounds, as described hereinafter. In other embodiments, the material without silicon of the at least one intermediate layer is a layer that comprises an epoxy-based material, such as a layer of the type known as "solder-resist", i.e., a thin layer of polymeric material designed to provide a protection against oxidation, in particular an epoxy-based material. In the case where the material constituting the solder-resist or epoxy-based layer is similar to a paint or an ink, possibly of a photosensitive type, it can be sprayed on or applied using silk-screen printing techniques or the like; on the other hand, the solder-resist or epoxy-based layer may also be made in the form of a film applied using a vacuum lamination method.

In the case exemplified in FIGS. 2-3, and in the corresponding FIGS. 4-7, between the overmoulded outer coating 30 and the electrodes J and $J_1$ of a respective array there are provided:

i) a first layer of composite material;
ii) a second layer of a material that is here assumed to be of a solder-resist or epoxy-based type; and
iii) a third, silica-based, layer.

In the case exemplified, the first layer of composite material has an epoxy-resin-based matrix that is filled with glass fibre. Very advantageously, the aforesaid first composite material may be constituted by one of the layers of the multilayer structure itself of the PCB 20. With reference also to FIGS. 4-7, in the non-limiting example illustrated, the supporting structure of the PCB 20 includes two layers $20_1$ on the outer face of which are set the corresponding electrodes J and $J_1$, respectively. Preferably, but not necessarily, between the two layers $20_1$ one or more further intermediate layers $20_2$ are provided (by the way, in other non-represented embodiments, the electrodes J and $J_1$ might be even arranged on the opposite major faces of one and the same layer of the PCB 20). The layers $20_1$ (or the opposite faces of the aforesaid one and the same layer) are in turn covered by respective outer layers $20_3$ of the same multilayered structure, such that the electrodes J and $J_1$ are correspondingly covered. Hence, in the example the layers $20_3$ constitute the opposite major sides (20*a*, FIG. 8) of the PCB 20. The various layers $20_1$, $20_2$ and $20_3$ of the PCB 20 are preferably formed with one same material, for instance FR4 or the like, even if this is not an essential feature.

Once again with reference to the non-limiting example illustrated in FIGS. 2-7, on outer layers $20_3$ of the multilayer structure of the PCB 20 there are respective second layers 40, which are here assumed as being of a solder-resist or epoxy-based type, designated by 40. It will be appreciated that, since the electrodes J and $J_1$ are arranged within the supporting structure of the PCB 20, the main function of the layers 40, when these are of a solder-resist or epoxy-based type, is to counter possible oxidative phenomena, and/or phenomena of infiltration of humidity and/or liquid, rather than preventing possible short-circuits.

In the example the layers 40 coat only the outer face of the layers $20_3$ of the PCB 20, preferably completely, but in other embodiments the layers 40 may belong to a single coating that surrounds the PCB 20, or at least one portion thereof at its major sides and its lateral edges or minor sides (as for the layer or coating 50 described hereinafter).

Finally, present on the PCB 20, i.e., on each of the layers 40, is the third layer substantially made of silica, designated by 50. The third layer 50, or each third layer 50, may be applied as an individual layer that coats a respective layer 40 or else, as in the case exemplified, may itself be applied as a coating that surrounds the PCB 20 on a number of sides and edges. For this reason, in what follows, the layer 50 will also be identified as "intermediate coating". Also the intermediate coating or layer 50 may surround or coat the entire PCB 20 or only a part of interest thereof.

By way of indication, the layers $20_3$ of composite material may have a thickness of between 0.2 mm and 0.4 mm, the layers 40 may have a thickness of between 10 μm and 30 μm, and the intermediate coating 50 (or at least its layer at the major sides of the PCB 20) may have a thickness of between 10 μm and 30 μm. The overmoulded outer coating 30 may have a thickness of between 1 mm and 2.4 mm, preferably of between 1.4 mm and 1.8 mm, very preferably between 1.5 and 1.6 mm.

The layers made of composite material $20_3$ are formed during production of the PCB 20 itself, themselves constituting part of its multilayer structure. As has been said, the multilayer structure of the PCB 20 may be obtained using materials such as FR4, or vetronite or similar electrically insulating composite materials, of a GRP (Glass-Reinforced Plastic) type. The preferred composites used are epoxy-based, such as an epoxy resin with glass fibre. The various layers of the structure of the PCB are preferably laminated on one another, according to a technique in themselves known in the sector of the manufacture of multilayer PCBs.

The layers 40 may be sprayed on the outer face of the layers $20_3$ but there is nothing in principle to rule out application of the epoxy material of the layers 40 in another way, for example via overmoulding.

Also the solution based on polysilazanes or silicon dioxide, which is to be converted prevalently into silica, i.e., to provide a vitreous intermediate coating 50, may be deposited or applied using spray-coating techniques, or else may be applied by dipping the PCB totally or partially in a container containing the liquid solution, i.e., using dip-coating techniques. Deposition may, on the other hand, be carried out using other known techniques, such as spin-coating (deposition by rotation of the PCB), flow-coating (deposition via a flow that impinges upon the PCB), CVD (Chemical Vapour Deposition), PVD (Physical Vapour Deposition), etc. These techniques may also be used for deposition of the layers 40.

As may be seen, according to an inventive aspect, the level-sensor device 10 may comprise four insulation elements or layers (30, 50, 40, $20_3$) that separate the electrodes J, $J_1$, i.e., the structure ($20_1$, $20_2$) that supports them, from the liquid undergoing detection.

Exemplified in FIGS. 9-12 is a possible sequence for producing the casing body of a device according to possible embodiments of the invention. Illustrated in FIG. 9 is the semi-finished product—including the PCB 20, the layers 40, and the intermediate coating or layers 50—designated as a whole by 20'. It is to be assumed that the aforesaid semi-finished product 20' is already provided, not only with the electrodes J and $J_1$, but also with the remaining part of the detection and/or processing circuitry. Applied to the semi-finished product 20' is the body part 21, for example shaped like a shell defining a cavity designed to receive at least partially the regions 25 and 26 of the PCB 20 (FIG. 8), i.e., of the semi-finished product 20'. As has been said, preferentially the part 21 integrates the connector body 15*a* and the terminals 17, with the latter that in this stage are electrically connected to corresponding conductive paths of the PCB 20.

Next (see FIG. 10), applied to the semi-finished product 20' is the body part 23, which—for example—is also shaped like a shell by defining here a cavity able to receive partially only the intermediate region 26 (FIG. 8), such that the latter is enclosed between said part 23 and a corresponding portion of the part 21 (said corresponding portion may be configured as a component being distinct and coupled to the body part 21). The two parts 21 and 23, in particular when they are both shaped like a shell, may be provided with means for mutual coupling, such as pins and seats of the part 21 designed to couple with corresponding seats and pins of the part 23.

Preferentially, the body parts 21 and 23 are made of a polymer having a melting point higher than 260° C. or in any case designed to resist this temperature in particular in order to be able to withstand possible overmoulding of at least one polymer at a temperature lower than 250° C., in particular a polymer designed to provide the outer coating 30 of the casing body of the device 10. For this purpose, in various embodiments, the material for the body parts 21 and 23 is selected from polyphthalamide (PPA), polyamide copolymers (PA66), and polyphenylene sulphide (PPS).

Possibly, before overmoulding of the outer coating 30, at the cavities of the body parts 21, 23 and of the corresponding portions of the semi-finished product 20', i.e., of the PCB 20, that are housed in said cavities, there may be applied a resin aimed at improving the characteristics of protection of the electrical and/or electronic components that are located in these regions. The resin or similar material used is preferably of the type with low melting point or polymerisation temperature, in particular a temperature of transformation such as not to damage the electrical and/or electronic components (such as a temperature of between 180° C. and 240° C., preferably close to 200° C.). A thermoplastic material suitable for the purpose, which is preferably relatively elastic or not stiff, may be of the so-called hot-melt or hot-glue type.

Next, at least the portion of the PCB 20, i.e., of the semi-finished product 20', that includes the detection region 24 is inserted in a mould for overmoulding the polymeric material that is to provide the outer coating 30. The material used for overmoulding of the coating 30 may be a thermoplastic material or else a thermosetting material. Preferred materials are high-density polyethylene (HDPE), polypropylene (PP), polyphthalamide (PPA), and polyphenylene sulphide (PPS).

Preferentially, the mould is configured for receiving also at least part of the intermediate region 26, provided with the body parts 21 and 23. In this case, in the course of the overmoulding operation, the circuit components possibly present in the intermediate region 26 of the PCB 20, i.e., of the semi-finished product 20', albeit located within the overmoulding area, are in any case protected, in view of the fact that this intermediate region is enclosed between the body parts 21 and 23; the protection is further increased in the presence of the aforesaid resin.

The result of the operation of overmoulding of the coating 30 is exemplified in FIG. 11, where the casing body of the device is now formed to a prevailing extent: as may be noted, the overmoulded coating 30 defines at least the detection portion 14 of the casing body and, preferably, at least part of its mounting portion 16, the outside of the latter being mainly obtained by the material moulded over the body part 23 and the corresponding portion of the body part 23.

The casing body of the device 10 may be then completed by associating to the semi-finished product of FIG. 11 one or more further body parts, in particular with the aim of obtaining the corresponding connection portion 15. To this purpose, by referring to FIG. 12, the body part 22 is coupled to the body part 21, which is not covered by the material of the coating 30, with at least one portion of the control region 25 (FIG. 8) of the PCB 20, i.e., of the semi-finished product 20', set between. The body part 22 may be configured as a distinct component, for example in the form of a shell fixed to the body part 21 (for example fixed by snap-fitting, or via threaded means, or welded, or glued), or the body part 22 may be also configured and an overmoulded part.

Embodiments of the sort represented in FIGS. 2-7 are particularly advantageous in so far as they prevent the humidity absorbed by the material of the coating 30 from possibly reaching the electrodes J and e $J_1$, or at least they considerably delay such humidity in reaching the electrodes J and $J_1$. In this perspective, the solution enables to possibly use, in order to obtain the overmoulded coating 30, thermoplastic material which are relatively cheaper and/or more easily mouldable, even if they have a lower resistance to humidity infiltration.

In various embodiments, the layer or layers 40 are omitted. An example in this sense is illustrated in FIGS. 13-16, where provided between the electrodes J and $J_1$ of the respective array and the coating 30 are two layers containing silicon or its derivatives or compounds, here represented by a layer $20_3$ of the PCB 20 and by an intermediate coating 50. In embodiments of the type illustrated in FIGS. 13-16, in any case, between the liquid undergoing level detection and the electrodes J and $J_1$ are, in addition to the outer coating 30, two further layers of different materials (50 and $20_3$). Insulation of the electrodes J and $J_1$ from the humidity or liquid that could possibly impregnate the coating 30, albeit reduced as compared to embodiments of the type exemplified in FIGS. 2-6, remains in any case high and more than sufficient for various applications of the device, for example for the use of some thermoplastic materials for obtaining the coating 3.

As may be seen, according to an inventive aspect, the level-sensor device 10 comprises at least three insulation elements or layers (30, 50, 40) that separate the electrodes J, $J_1$, i.e., the structure ($20_1$, $20_2$) that supports them, from the liquid undergoing detection.

In various embodiments, the electrodes J and/or $J_1$ are not arranged within the structure of the PCB 20, but arranged at a respective outer face of said structure. An example in this sense is illustrated in FIGS. 17-20. In the example illustrated in these figures the outer layers $20_3$ of the PCB 20 are hence not present, with the electrodes J and $J_1$ that directly give out onto the outside of the PCB itself, in position corresponding to the opposite major sides thereof (here represented by the layers $20_1$ that carries the electrodes); however, as already said, the electrodes could be set on one side only of the PCB. It will be appreciated that, in embodiments of this sort, the PCB 20 does not necessarily have a multilayer structure. In the case of FIGS. 17-20, the layers 40, for example of a solder-resist or epoxy type, are present, applied directly on the layers $20_1$ of the PCB 20 so as to cover also the electrodes J and $J_1$. In embodiments of the type in which the material necessary for formation of the layers 40 is in the form of paint or ink, this material may, if necessary, be applied—for example, via silk-screen deposition—in such a way that the outer surface of the layers 40 is substantially plane, as in the case illustrated (i.e., the corresponding material will be deposited in such a way that the thickness of the layers 40 is smaller in the area of the electrodes J and $J_1$). This does not, however, constitute an essential characteristic for the purposes of operation of the device.

Also in embodiments of the type illustrated in FIGS. 17-20, in any case, set between the liquid undergoing level detection and the electrodes J and $J_1$ are—in addition to the outer coating 30—two further layers of different materials (40 and 50), and this enables to obtain the the overmoulded coating 30 with thermoplastic materials which are cheaper and/or more easily workable in order to obtain a longitudinally extended coating, as required by the use proposed herein.

Also in this case, according to an inventive aspect, the level-sensor device 10 comprises three insulation elements or layers (30, 50, 40) that separate the electrodes J, $J_1$, i.e., the structure ($20_1$, $20_2$) that supports them, from the liquid undergoing detection.

In various embodiments, the intermediate coating or the layers 50 are omitted. An example in this sense is illustrated in FIGS. 21-24, according to which between the electrodes J and $J_1$ of the respective array and the coating 30 are two layers of different materials, here represented by a layer $20_3$ of the PCB 20 and a layer 40, for example of a solder-resist or epoxy-based type, are in any case provided. Hence, also in this case, set between the liquid undergoing level detection and the electrodes J and $J_1$ are, in addition to the outer coating 30, two further layers of different materials (layers 40 and $20_3$), which prevents or in any case delays the electrodes from being reached by the humidity which may impregnate with the passing of time the coating 30.

Hence, also in this case, the level-sensor device 10 comprises three insulation elements or layers (30, 40, $20_3$) that separate the electrodes J, $J_1$, i.e., the structure $20_k$, $20_2$ that supports them, from the liquid undergoing detection.

FIGS. 25-28 exemplify further possible embodiments, where the layers 40 are omitted and the electrodes J and/or $J_1$ are not arranged within the structure of the PCB 20, but in a position corresponding to a respective outer face of this structure. Hence, also in this case, the outer layers $20_3$ of the PCB 20 are absent, with the electrodes J and $J_1$ that directly give out on the outside of the PCB, in positions corresponding to its two major opposite sides (also here represented by the layers $20_1$ that carry the electrodes). The intermediate coating or the layers 50 are thus applied directly on the layers $20_1$ of the PCB 20 so as to cover also the electrodes J and $J_1$. It will be appreciated that, also in embodiments of this type, the PCB 20 does not necessarily have a multilayer structure. In embodiments of the type illustrated in FIGS. 25-28 set between the liquid undergoing level detection and the electrodes J and $J_1$ is, in addition to the coating 30, only the silica-based intermediate coating or layer 50.

In this inventive configuration, the level sensor device 10 comprises two insulation element or layers (30, 50) which separate the electrodes J, $J_1$, i.e., the structure $20_1$, $20_2$ supporting them, from the liquid undergoing detection.

The hygroscopic insulation thus obtained, albeit reduced as compared to other embodiments described previously, is in any case sufficient for various applications of the device, in particular when the material used for providing of the intermediate layer 50 is a vitreous or silica-based layer that uniformly coats the PCB 20, without leaving any passages or porosities, and hence with good sealing characteristics, even though it has a small thickness.

FIGS. 29-32 exemplify further possible embodiments, where both the layers 40 and the intermediate coating or layers 50 are omitted, with the electrodes J and $J_1$ that are arranged within the multilayer structure of the PCB 20, underneath the outer layers $20_3$. Hence, also in embodiments of this type, set between the liquid undergoing level detection and the electrodes J or $J_1$ is, in addition to the outer coating 30, just one layer $20_3$ belonging to the multilayer structure of the PCB 20. Also structures of this type are sufficient for protection or at least for delaying the negative effects of possible absorption of humidity or liquid by the material used for obtaining the overmoulded coating 30.

Also in this inventive configuration, the level sensor device 10 comprises two insulation element or layers (30, $20_3$) which separate the electrodes J, $J_1$, i.e., the structure $20_1$, $20_2$ supporting them, from the liquid undergoing detection.

Likewise, FIGS. 33-36 exemplify further possible embodiments, where the intermediate coating or layers 50 are omitted, and the electrodes J and $J_1$ are not arranged within the structure of the PCB 20, but in a position corresponding to a respective outer face of the structure. Hence, also in this case, no outer layers $20_3$ of the PCB 20 is present, but laid on the layers $20_1$ that carry the electrodes J and $J_1$ are applied respective layers 40, for example of a solder-resist or epoxy-based type, so as to cover the electrodes themselves. It will be appreciated that, also in embodiments of this type, the PCB 20 does not necessarily have a multilayer structure. In embodiments of this type, set between the liquid undergoing level detection and the electrodes J or $J_1$ is, in addition to the outer coating 30, just the layer 40, which is in any case sufficient in various applications.

Also in this inventive configuration, the level sensor device 10 comprises two insulation element or layers (30, 40) which separate the electrodes J, $J_1$, i.e., the structure $20_1$, $20_2$ supporting them, from the liquid undergoing detection.

Provision of an intermediate coating or layers 50 prevalently made of silica obtained starting from a polysilazane-based composition is particularly advantageous also because, during the corresponding polymerisation, the silicon binds to the —OH group of the corresponding substrate 20, and/or 40. In this way a bond tendentially of a secondary type is obtained between the intermediate coating 50 and the underlying substrate (which, according to the cases, is constituted by a layer 40 or a layer $20_3$) which contributes to improving fixing between the materials and hence the strength of the structure. In this perspective, as mentioned previously, in various embodiments, the PCB 20 and/or the layers 40 are preferentially formed using an epoxy-based material, i.e., one comprising an —OH group, thereby guaranteeing a chemical bond with the intermediate coating 50 and/or the layers 40. Once again in this perspective, the electrodes J and $J_1$ are preferably made of a metal or metal alloys (for example, copper or copper-based alloys). Given that in the production stage on the aforesaid metal there occur in any case pseudo-oxidation processes with grafting of —OH functional groups, also in the cases where the polysilazane-based or silicon-dioxide-based solution is applied partially in contact with the electrodes J, basic chemical bonds (—OH or else O* functional groups) form between the metal and the polysilazanes or silicon dioxide, with consequent advantages in terms of fixing between the different materials.

In various particularly advantageous embodiments, the epoxy-based layers designated previously by 40 may be substituted by layers 40' made of a polymer containing precursors, or derivatives, or compounds of fluorine such as a fluorinated polymer or fluoropolymer or perfluorinated polymer, preferably without perfluorooctane sulphonate (PFOS) and perfluorooctanoic acid (PFOA). For this reason, in various ones of the figures mentioned above, associated to the reference number 40 is also the reference number 40' in brackets. Preferred materials are, for example, fluorinated ethylene propylene (FEP), polytetrafluorine ethylene (PTFE) and, more in general, fluorine-acrylate-based polymers. The configurations described previously, where the layers 40 are envisaged are hence to be understood as valid in the case where these layers are substituted by layers 40' made of a polymer containing precursors or derivatives or composites of fluorine. Also the layers 40' may belong to an intermediate coating that surrounds the PCB 20, i.e., that extends also at the edges or minor sides of the PCB (as illustrated, for example, in FIGS. 37-46). The layers or coatings 40' may have a thickness of between 10 μm and 70 μm.

The studies conducted by the present Applicant have made it possible to ascertain that fluorine-based polymeric materials, or derivatives or compounds of fluorine (such as completely or partially fluorinated fluoropolymers), are particularly advantageous for the purposes of the application proposed herein. Fluorates, in addition to being chemically very resistant, present an excellent resistance also at high temperatures, and are thus perfectly suitable for withstanding overmoulding of the coating 30. These materials are moreover relatively flexible, or not stiff, and relatively deformable or compressible, and are hence able to withstand very well thermal expansion and thermal shock, likewise presenting very low coefficients of friction, with a consequent possibility of withstanding the relative movements that, on account of different coefficients of thermal expansion, may occur between the overmoulded material of the coating 30 and the PCB 20 (and/or possible other layers, such as the layers 40 and/or 50).

Practical permeation tests conducted by the present Applicant have also made it possible to ascertain that fluorinated polymers enable excellent results to be obtained in terms of resistance to water-urea solutions, such as AdBlue, this also by virtue of the very low surface energy of the fluorinated polymers, which are highly hydrophobic. This characteristic is particularly advantageous in the case where the liquid of which the level is be detected is water or a water-based solution (such as AdBlue, which prevalently consists of water).

The presence of an intermediate layer 40' made of fluorinated polymer moreover enables good protection against chemical aggression of the electrodes, and/or of the PCB 20, in the case of any infiltration of water-urea solutions through the coating 30.

The use of fluoropolymers for producing layers or coatings 40' is particularly advantageous also in view of the fact that, in various configurations, during polymerisation of the material, it is possible to obtain chemical and/or structural bonds with the materials of the corresponding substrate. This is particularly advantageous when the PCB 20 and/or the layers 40 are made of epoxy-based materials. In this perspective, as already mentioned, the material for the PCB 20 is preferentially epoxy-based (for example FR4, the matrix of which is in general constituted by an epoxy resin), and the layers 40 of a solder-resist type are also made of an epoxy resin.

For instance, illustrated in FIGS. 37-40 is the case where between the overmoulded outer coating 30 and the electrodes J and $J_1$ of a respective array there are provided:

i) a first layer of composite material 20$_3$;
ii) a second layer of material 40; and
iii) a third layer 40' with a fluorinated-polymer base;

According to embodiments (not illustrated), the layer of composite material 20$_3$ may be omitted.

In the case exemplified in the figure, the possible first layer of composite material is constituted by an outer layer 20$_3$ of the multilayer structure of the PCB so that the electrodes J and $J_1$ are coated accordingly, whereas the layer 40 belongs to an intermediate coating of a solder-resist or epoxy-based type, which coats the structure of the PCB 20 at its major sides and its edges or minor sides. The third layer 40' belongs, instead, to a further fluorinated-polymer intermediate coating, for example made of FEP, which surrounds the epoxy-based coating to which the layers 40 belong. The material of the outer coating 30 is then overmoulded on the coating to which the layers 40' belong.

In solutions of the type exemplified in FIGS. 37-40, provided between the layers or coating 40' and the layers or coating 40 is a hydrogen bond between the —OH group of the epoxy-based substrate, here represented by the layers or coating 40, with the more electronegative atoms of the fluorine of the fluorinated polymer, for example the FEP, that provides the layers or coating 40'. The hydrogen bond or hydrogen bridge is a particular case of intermolecular force implicated in which is a hydrogen atom involved in a covalent bond with very electronegative elements (such as fluorine, oxygen, or nitrogen), which attract to themselves the valence electrons, acquiring a partial negative charge ($\delta-$), leaving the hydrogen with a partial positive charge ($\delta+$). Simultaneously, the hydrogen is attracted by an electronegative atom of a nearby molecule.

Figure 41:
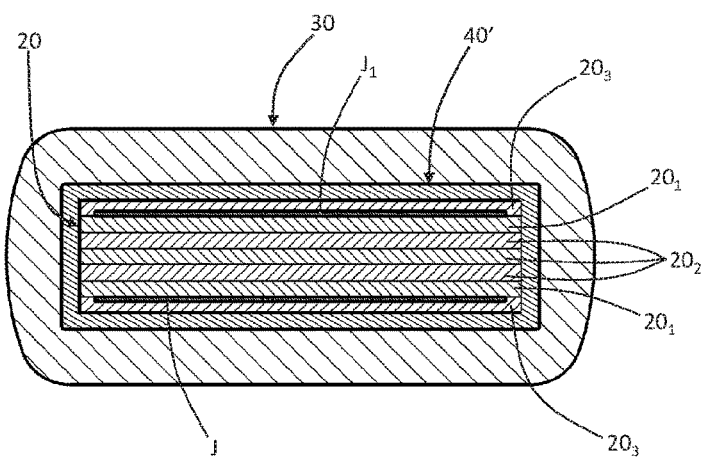
FIGS. 41 and 42 are schematic cross-sectional views similar to those of FIG. 39, regarding level-sensor devices according to further possible embodiments of the invention.
Figure 42:
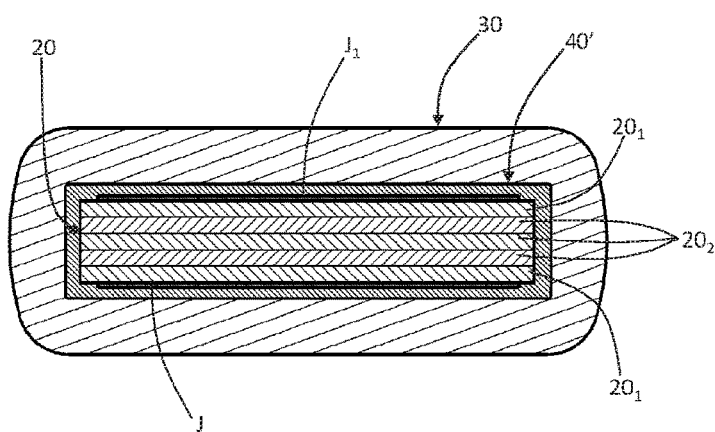
Figure 45:
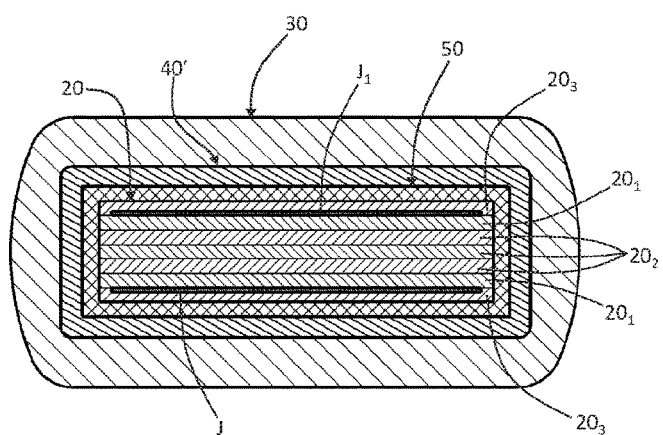
FIGS. 45 and 46 are schematic cross-sectional views according to the lines XLV-XLV and XLVI-XLVI, respectively, of FIG. 44.
Figure 46:
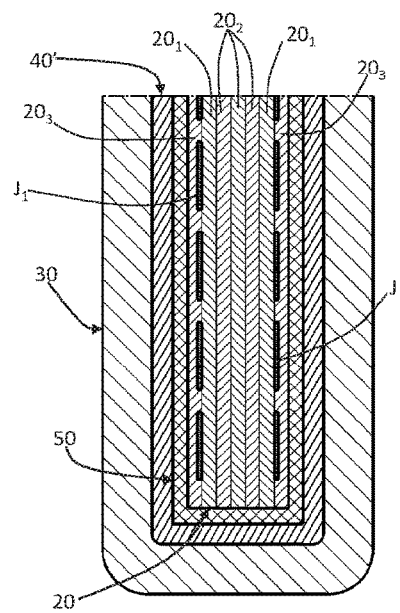

It will thus be appreciated that the aforesaid bond contributes to improving fixing between the materials, and hence to the strength of the structure. Bonds similar to the ones just exemplified are formed when layers or coatings of the type designated by 40' are applied directly on a PCB 20 made at least in part of an epoxy resin. Cases of this type are exemplified in FIGS. 41 and 42. FIG. 41 regards the case of a coating 40' that coats a multilayer PCB 20, where the electrodes J and/or $J_1$ are already covered with a layer made of composite 20$_3$, whereas FIG. 42 regards the case of a PCB with electrodes J and/or $J_1$ exposed (i.e., on the outer faces of the layers 20$_1$).

According to one aspect, the present invention proposes elimination or at least reduction of possible mechanical stresses to which internal elements of the level-sensor device may be subjected (such as the PCB 20, and/or circuit components carried by the PCB, and/or intermediate layers of material between the PCB and the outer coating), due for example to shrinkage of the overmoulding material of the outer coating 30 and/or deformations due to external pressures of thrusts by the frozen liquid and/or following upon dimensional variations due to thermal jumps or shocks (for example, following upon heating of the frozen liquid, and/or variations of the ambient temperature).

For this reason, in embodiments in themselves inventive, and as already mentioned previously, at least one intermediate layer of the device performs functions of mechanical compensation and comprises for this purpose a material or polymer that is at least in part flexible, or deformable, or compressible, on which there is to be overmoulded the material of the coating 30, where preferably the coating 30 is made of a polymer that is stiffer than the material of the aforementioned compensation intermediate layer.

For instance, as mentioned previously, fluoropolymers are relatively flexible, and/or deformable, and distinguished by low surface friction so that the corresponding layers can advantageously perform functions of mechanical compensation, for instance, in order to absorb possible mechanical stresses determined by the coating 30 with respect to an underlying substrate, such as the PCB 20 or the coating 40. As has been said, these mechanical stresses may be due to shrinkage of the outer coating 30 and/or to stresses on the sensor device induced by the frozen liquid or frozen parts thereof, and/or following upon thermal shock that induces dimensional variations of parts of the device.

In other embodiments, the aforementioned functions of compensation of the aforesaid possible stresses may be obtained by means of one or more layers 40' made of relatively elastic, and/or compressible, and/or deformable elastomers or polymers different from the ones referred to previously, even ones not containing fluorine derivatives or compounds.

In particularly advantageous embodiments of the invention, it is also possible to combine an intermediate layer or coating of the type designated previously by 50, which is relatively more rigid and brittle and hence potentially subject to the risk of cracking following upon mechanical deformations or strains, with a fluorinated layer or coating that coats the first layer 50, so as to prevent excessive shrinkage and/or deformations during the settling step of the overmoulded material of the coating.

Such a case is exemplified in FIGS. 43-46, where applied to a multilayer PCB 20 is an intermediate coating 50 made of silica or silicon oxide, of the type described previously, on which an intermediate coating 40', made of a fluoropolymer, is in turn applied. It will be appreciated that solutions of this sort enable maximization of insulation of the electrodes J and/or $J_1$ in regard to humidity and/or liquid that may impregnate the overmoulded material of the outer coating.

It should moreover be emphasised that the higher flexibility (or yielding, or compressibility, or deformability) of a coating made of a fluoropolymer as compared to corresponding substrates of a vitreous type (50), or composite type (20), or epoxy type (20, 40) protects the latter from mechanical strains, deformation and stresses which may originate during freezing of the liquid undergoing detection and due to possible impacts with ice pieces formed in said liquid.

In general, the functions of mechanical compensation described above with reference to FIGS. 37-42 hence also apply in the case exemplified in FIGS. 43-46, in particular in order to safeguard the integrity of the vitreous coating 50.

From the foregoing description the characteristics of the present invention emerge clearly, as do its advantages, mainly represented by the simplicity of construction of the level-sensor device proposed, its contained cost, and its precision and reliability.

It is clear that numerous variants may be made by the person skilled in the branch to the devices and methods described herein purely by way of example, without thereby departing from the scope of the invention as defined by the annexed claims.

As indicated previously, presence of two arrays of electrodes, each one in a position corresponding to one side of the PCB 20, does not constitute an essential characteristic of the device 10, which may be provided with just the electrodes J or just the electrodes $J_1$. Hence, in the devices 10 of this type, the number of intermediate between the outer coating 30 and the electrodes J or $J_1$ may be correspondingly reduced, for example by exploiting just one of the outermost layers $20_3$ of the PCB 20 for the purposes of the invention and/or by providing just one layer 40 (and/or 40') and/or at the side of interest of the PCB 20. By the way, also in the case of a device 10 provided with a single array of electrodes J or $J_1$, the insulating structure may comprise layers 40 (and/or 40'), and/or 50 also on the side of the PCB where the level-detection electrodes are not present.

The PCB of the sensor device according to the invention does not necessarily have to be made using an epoxy-based material or a material including silicon or its derivatives or compounds. In possible variant embodiments, the PCB 20—even one not having a multilayer structure—may be obtained using, for example, a fluorinated polymer or PTFE, or a polyimide, or ceramic materials.

The invention has been described with particular reference to detection of the level of a liquid medium, in particular water or a urea-and-water-based additive, but as already mentioned the sensor described can be used in combination with different substances and materials, even ones potentially subject to solidification by freezing.

In some applications, it is possible for a level measurement with different areas of detection to be required, each of which has a different measurement resolution and which are located in different positions of the detection part 11 of the device 10. This need leads, for example, to positioning electrodes having different geometries—in terms of shape and size—along the detection region 24 of the PCB 20 in order to guarantee the resolution or tolerance of measurement required in the given area. This choice is in some cases limited by the need to minimise the cost of the control electronics of the device, and in particular of a controller thereof (which is linked to the number of its inputs and hence to the number of electrodes that it is able to manage). For this reason, in some applications, it may prove convenient to increase the size of the electrodes in the areas where maximum resolution of detection is not necessary (typically at the two ends). In this perspective, according to possible variant embodiments, the array or arrays of capacitive elements provided in a position corresponding to a major face, or each major face, of the PCB 20, in its detection region 24, may comprise a number of series of electrodes J or $J_1$ diversified from one another in terms of shapes and/or size.

Individual characteristics described with reference to embodiments described previously may be combined with one another in other embodiments.

Reference has previously been made to functions of mechanical compensation performed by one or more intermediate layers or coatings, which are, for example, made of materials with a base of fluorine derivatives or compounds, or else of elastomers not necessarily including fluorine derivatives or compounds. Layers or coatings of this type, owing to their elastic and/or compliant nature may extend or be provided also in regions of the circuit support different from the detection region, such as the regions 25 and/or 26, in particular in order to coat and protect possible electrical and/or electronic components mounted in an exposed position on a circuit support or substrate, such as the PCB 20.

As has been mentioned, on the circuit support of the device according to the invention there may be provided at least one temperature sensor, which, like the electrodes J and/or $J_1$, may be insulated from the liquid undergoing level detection by at least two layers of material (30, 50, 40, 40', $20_3$).

The invention claimed is:

1. A capacitive level sensor device, for detecting the level of a medium contained in a container,
    wherein the device comprises a circuit support, which extends longitudinally substantially according to level-detection axis, the circuit support having a first longitudinal end and a second longitudinal end,
    wherein the circuit support has, in a detection region thereof that includes said first longitudinal end, at least one first plurality of first capacitive elements, which comprise at least one first array of first electrodes, the first electrodes being made of an electrically conductive material and arranged at least in part in a position corresponding to at least one first side of a supporting structure of the circuit support,
    wherein the device has a casing body which comprises an electrically insulating and fluid-tight detection portion, which covers the detection region of the circuit support,
    wherein the detection portion of the casing body comprises an overmoulded outer coating, made of a first electrically insulating polymeric material, the first electrically insulating polymeric material defining an outer surface of the casing body which is designed to be in contact with the medium the level of which has to be detected,
    wherein the first electrodes are enclosed within the supporting structure of the circuit support at least at the detection region thereof,
    wherein, at least at the detection region, between at least part of the overmoulded outer coating and the supporting structure of the circuit support there is set at least one intermediate layer made of an electrically insulating material different from the first electrically insulating polymeric material,
    wherein the supporting structure of the circuit support is a multilayer structure made of a plurality of layers of electrically insulating material,
    and wherein the first electrodes are set between two layers of electrically insulating material of the multilayer structure, in such a way that one of said two layers obtains one said at least one intermediate layer.

2. The device according to claim 1, wherein the at least one intermediate layer comprises a layer made of a material which includes silicon, or derivatives or compounds thereof.

3. The device according to claim 1, wherein the at least one intermediate layer comprises a mechanical-compensation layer made of a material which is more flexible or deformable or compressible or yielding than the first electrically insulating polymeric material of the overmoulded outer covering, the first electrically insulating polymeric material being overmoulded on the mechanical-compensation layer.

4. A capacitive level sensor device, for detecting the level of a medium contained in a container,
wherein the device comprises a circuit support, which extends longitudinally substantially according to level-detection axis, the circuit support having a first longitudinal end and a second longitudinal end,
wherein the circuit support has, in a detection region thereof that includes said first longitudinal end, at least one first plurality of first capacitive elements, which comprise at least one first array of first electrodes, the first electrodes being made of an electrically conductive material and arranged at least in part in a position corresponding to at least one first side of a supporting structure of the circuit support,
wherein the device has a casing body which comprises an electrically insulating and fluid-tight detection portion, which covers the detection region of the circuit support,
wherein the detection portion of the casing body comprises an overmoulded outer coating, made of a first electrically insulating polymeric material, the first electrically insulating polymeric material defining an outer surface of the casing body which is designed to be in contact with the medium the level of which has to be detected,
wherein the first electrodes are enclosed within the supporting structure of the circuit support at least at the detection region thereof,
and wherein, at least at the detection region, between at least part of the overmoulded outer coating and the supporting structure of the circuit support there is set at least one intermediate layer made of an electrically insulating material different from the first electrically insulating polymeric material, and
wherein the at least one intermediate layer comprises a layer made of a material which includes fluorine derivatives or compounds.

5. The device according to claim 3, wherein the mechanical-compensation layer comprises a fluoropolymer.

6. The device according to claim 1, wherein the at least one intermediate layer comprises at least one layer made of a material which includes silicon, or derivatives or compounds thereof, and at least one layer made of a material that includes fluorine derivatives or compounds.

7. A capacitive level sensor device, for detecting the level of a medium contained in a container,
wherein the device comprises a circuit support, which extends longitudinally substantially according to level-detection axis, the circuit support having a first longitudinal end and a second longitudinal end,
wherein the circuit support has, in a detection region thereof that includes said first longitudinal end, at least one first plurality of first capacitive elements, which comprise at least one first array of first electrodes, the first electrodes being made of an electrically conductive material and arranged at least in part in a position corresponding to at least one first side of a supporting structure of the circuit support,
wherein the device has a casing body which comprises an electrically insulating and fluid-tight detection portion, which covers the detection region of the circuit support,
wherein the detection portion of the casing body comprises an overmoulded outer coating, made of a first electrically insulating polymeric material, the first electrically insulating polymeric material defining an outer surface of the casing body which is designed to be in contact with the medium the level of which has to be detected,
wherein the first electrodes are enclosed within the supporting structure of the circuit support at least at the detection region thereof,
wherein, at least at the detection region, between at least part of the overmoulded outer coating and the supporting structure of the circuit support there is set at least one intermediate layer made of an electrically insulating material different from the first electrically insulating polymeric material, and
wherein the at least one intermediate layer comprises at least one layer substantially made of silicon oxide.

8. The device according to claim 1, wherein the supporting structure of the circuit support is formed at least in part with an epoxy-based material.

9. The device according to claim 1, wherein the at least one intermediate layer moreover comprises at least one layer of an epoxy-based material.

10. A capacitive level sensor device, for detecting the level of a medium contained in a container,
wherein the device comprises a circuit support, which extends longitudinally substantially according to level-detection axis, the circuit support having a first longitudinal end and a second longitudinal end,
wherein the circuit support has, in a detection region thereof that includes said first longitudinal end, at least one first plurality of first capacitive elements, which comprise at least one first array of first electrodes, the first electrodes being made of an electrically conductive material and arranged at least in part in a position corresponding to at least one first side of a supporting structure of the circuit support,
wherein the device has a casing body which comprises an electrically insulating and fluid-tight detection portion, which covers the detection region of the circuit support,
wherein the detection portion of the casing body comprises an overmoulded outer coating, made of a first electrically insulating polymeric material, the first electrically insulating polymeric material defining an outer surface of the casing body which is designed to be in contact with the medium the level of which has to be detected,
wherein the first electrodes are enclosed within the supporting structure of the circuit support at least at the detection region thereof,
wherein, at least at the detection region, between at least part of the overmoulded outer coating and the supporting structure of the circuit support there is set at least one intermediate layer made of an electrically insulating material different from the first electrically insulating polymeric material, and
wherein the circuit support has, in the detection region thereof, at least one second plurality of capacitive elements that comprise a second array of second electrodes, the second electrodes being formed with an electrically conductive material and arranged at least in part in a position corresponding to a second side of the circuit support.

11. The device according to claim 10, wherein, also in a position corresponding to the second electrodes, between the overmoulded outer covering and the supporting structure of the circuit support-, there is set one said at least one intermediate layer made of an electrically insulating material different from the first electrically insulating polymeric material.

12. A capacitive level sensor device, to detect the level of a medium contained in a container,
- wherein the device comprises a circuit support, which extends longitudinally substantially according to level-detection axis, the circuit support having a first longitudinal end and a second longitudinal end,
- wherein the circuit support has, in a detection region thereof that includes said first longitudinal end, at least one first plurality of first capacitive elements which comprise at least one first array of first electrodes, the first electrodes being made with an electrically conductive material and arranged at least in part in a position corresponding to at least one first side of a load-bearing structure of the circuit support,
- wherein the device has a casing body which comprises an electrically-insulating and fluid-tight detection portion, which covers the detection region of the circuit support,
- wherein the detection portion of the casing body comprises an overmoulded outer covering, formed with a first electrically insulating polymeric material, the first electrically insulating polymeric material defining an outer surface of the casing body which is designed to be in contact with the medium the level of which has to be detected,
- wherein between at least part of the overmoulded outer covering and the first electrodes there is set at least one intermediate layer made of an electrically insulating material different from the first electrically insulating polymeric material,
- wherein the at least one intermediate layer comprises a mechanical-compensation layer formed with a material which is more flexible or deformable or compressible or yielding than the first electrically insulating polymeric material of the overmoulded outer covering, and
- wherein the mechanical-compensation layer is operable for compensating at least one of the following:
- possible shrinkage of the first electrically insulating polymeric material forming the overmoulded outer covering;
- possible deformations of the overmoulded outer covering induced by external pressures of thrusts due to freezing of the medium contained in the container;
- possible dimensional variations of the overmoulded outer covering due to thermal jumps or shocks induced by heating of the medium contained in the container or by variations of ambient temperature.

13. The device according to claim 1, wherein the first electrodes are spaced from one another along the level-detection axis.

14. The device according to claim 1, wherein the first electrically insulating polymeric material is selected from among thermoplastic polymers or thermosetting polymers.

15. The device according to claim 7, wherein the least one layer substantially made of silicon oxide is formed starting from a composition including a silazane, or a polysilazane, or perhydropolysilazane.

16. The device according to claim 8, wherein the epoxy-based material comprises a composite material having an epoxy resin matrix and/or a glass-fibres filler.

17. The device according to claim 10, wherein the second electrodes are spaced from one another along the level-detection axis.

* * * * *